(12) United States Patent
Horikawa et al.

(10) Patent No.: US 9,282,629 B2
(45) Date of Patent: Mar. 8, 2016

(54) WIRING SUBSTRATE AND SEMICONDUCTOR PACKAGE

(71) Applicant: SHINKO ELECTRIC INDUSTRIES CO., LTD., Nagano (JP)

(72) Inventors: Yasuyoshi Horikawa, Nagano (JP); Tatsuaki Denda, Nagano (JP); Hiroshi Shimizu, Nagano (JP); Kazutaka Kobayashi, Nagano (JP)

(73) Assignee: SHINKO ELECTRIC INDUSTRIES CO., LTD., Nagano (JP)

(*) Notice: Subject to any disclaimer, the term of this patent is extended or adjusted under 35 U.S.C. 154(b) by 0 days.

(21) Appl. No.: 14/583,227

(22) Filed: Dec. 26, 2014

(65) Prior Publication Data

US 2015/0230328 A1 Aug. 13, 2015

(30) Foreign Application Priority Data

Feb. 12, 2014 (JP) .................................. 2014-024472

(51) Int. Cl.

| | | |
|---|---|---|
| H01L 23/367 | (2006.01) | |
| H05K 1/02 | (2006.01) | |
| H05K 3/00 | (2006.01) | |
| H01L 23/14 | (2006.01) | |
| H01L 21/48 | (2006.01) | |
| H01L 33/64 | (2010.01) | |

(52) U.S. Cl.
CPC .............. *H05K 1/0207* (2013.01); *H01L 21/486* (2013.01); *H01L 23/145* (2013.01); *H01L 23/367* (2013.01); *H01L 33/64* (2013.01); *H05K 1/0204* (2013.01); *H05K 3/0061* (2013.01); *H01L 2224/16225* (2013.01); *H01L 2224/32225* (2013.01); *H01L 2224/48227* (2013.01); *H01L 2224/73265* (2013.01); *H05K 1/0206* (2013.01); *H05K 2201/09054* (2013.01)

(58) Field of Classification Search
CPC .... H01L 21/4763; H01L 23/52; H01L 23/367; H01L 21/486; H05K 1/186; H05K 13/04; H05K 1/0283
USPC .......................................... 361/749; 257/773
See application file for complete search history.

(56) References Cited

U.S. PATENT DOCUMENTS

| | | | |
|---|---|---|---|
| 2005/0272252 A1 | 12/2005 | Usui et al. | |
| 2013/0192880 A1 | 8/2013 | Nakanishi et al. | |
| 2014/0145526 A1* | 5/2014 | Shirakata et al. | ............... 310/52 |
| 2014/0268780 A1* | 9/2014 | Wang et al. | ............. 362/249.06 |
| 2014/0313716 A1* | 10/2014 | Lang | ............................ 362/235 |

FOREIGN PATENT DOCUMENTS

| | | |
|---|---|---|
| JP | 2005-340578 | 12/2005 |
| JP | 2013-157441 | 8/2013 |

* cited by examiner

*Primary Examiner* — Nathan Ha
(74) *Attorney, Agent, or Firm* — IPUSA, PLLC

(57) ABSTRACT

A wiring substrate includes a heat spreader, a first insulating layer provided on the heat spreader via an adhesion layer, the first insulating layer, a plurality of through wirings formed to fill through holes provided at the first insulating layer, respectively, a thermal diffusion wiring provided on the first insulating layer so as to be connected to the through wirings, the thermal diffusion wiring being configured not to be electrically connected to a semiconductor device, an electrical connection wiring provided on the first insulating layer, the electrical connection wiring being configured to be electrically connected to the semiconductor device, wherein the heat spreader is provided with a projection portion, made of a composition same as the heat spreader, at a surface of the heat spreader on which the adhesion layer is formed, the projection portion being aimed at least at an area overlapping the through wirings in a plan view.

9 Claims, 14 Drawing Sheets

WIRING SUBSTRATE AND SEMICONDUCTOR PACKAGE

CROSS-REFERENCE TO RELATED APPLICATION

The present application is based on and claims the benefit of priority of Japanese Priority Application No. 2014-024472 filed on Feb. 12, 2014, and the entire contents of which are hereby incorporated by reference.

BACKGROUND OF THE INVENTION

1. Field of the Invention

The present invention relates to a wiring substrate and a semiconductor package.

2. Description of the Related Art

Recently, a wiring substrate has been provided for mounting a semiconductor device such as a light emitting device or the like. For example, a wiring substrate is known in which a wiring is formed on a heat spreader via an insulating layer. In such a wiring substrate, when heat is generated by a semiconductor device that is mounted on the wiring, it is necessary to transfer the heat to the heat spreader. At this time, as the insulating layer functions as a part of a radiation path, it is preferable that the thickness of the insulating layer is thin. On the other hand, it is preferable that the thickness of the insulating layer is thick in order to ensure an insulation property between wirings and the heat spreader.

As such, in a conventional wiring substrate on which a semiconductor device that generates heat is mounted, ensuring an insulation property and improving a thermal radiation property are in a trade-off relationship and it is difficult to ensure the insulation property while improving the thermal radiation property at the same time.

[Patent Document]
[Patent Document 1] Japanese Laid-open Patent Publication No. 2013-157441

SUMMARY OF THE INVENTION

The present invention is made in light of the above problems, and provides a wiring substrate or the like capable of ensuring an insulation property and improving a thermal radiation property at the same time.

According to an embodiment, there is provided a wiring substrate on which a semiconductor device is to be mounted, the wiring substrate including a heat spreader; a first insulating layer provided on the heat spreader via an adhesion layer, the first insulating layer being provided with a plurality of through holes penetrating the first insulating layer in the thickness direction; a plurality of through wirings formed to fill the through holes provided at the first insulating layer, respectively; a thermal diffusion wiring provided on the first insulating layer so as to be connected to the through wirings, the thermal diffusion wiring being configured not to be electrically connected to the semiconductor device; an electrical connection wiring provided on the first insulating layer, the electrical connection wiring being configured to be electrically connected to the semiconductor device; and a second insulating layer provided on the first insulating layer and provided with a first open portion that exposes the electrical connection wiring and a second open portion that exposes the thermal diffusion wiring, wherein the heat spreader is provided with a projection portion at a surface of the heat spreader on which the adhesion layer is formed, wherein the projection portion is made of a composition same as the heat spreader, and wherein the projection portion is formed at least at an area overlapping the through wirings in a plan view.

Note that also arbitrary combinations of the above-described elements, and any changes of expressions in the present invention, made among methods, devices, systems and so forth, are valid as embodiments of the present invention.

BRIEF DESCRIPTION OF THE DRAWINGS

Other objects, features and advantages of the present invention will become more apparent from the following detailed description when read in conjunction with the accompanying drawings.

DETAILED DESCRIPTION OF THE PREFERRED EMBODIMENTS

Figure 1A:
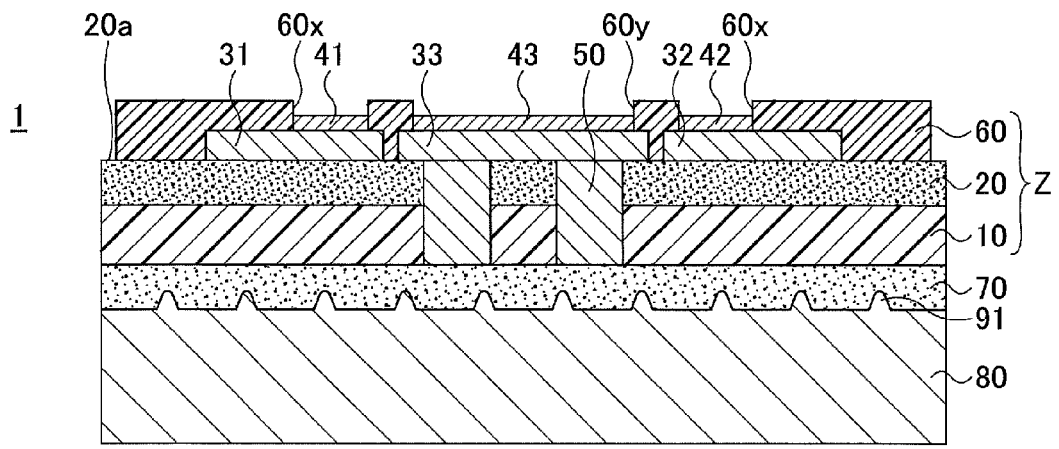
FIG. 1A and FIG. 1B are views illustrating an example of a wiring substrate of a first embodiment.

The invention will be described herein with reference to illustrative embodiments. Those skilled in the art will recognize that many alternative embodiments can be accomplished using the teachings of the present invention and that the invention is not limited to the embodiments illustrated for explanatory purposes.

It is to be noted that, in the explanation of the drawings, the same components are given the same reference numerals, and explanations are not repeated.

First Embodiment

Structure of Wiring Substrate of First Embodiment

Figure 1B:
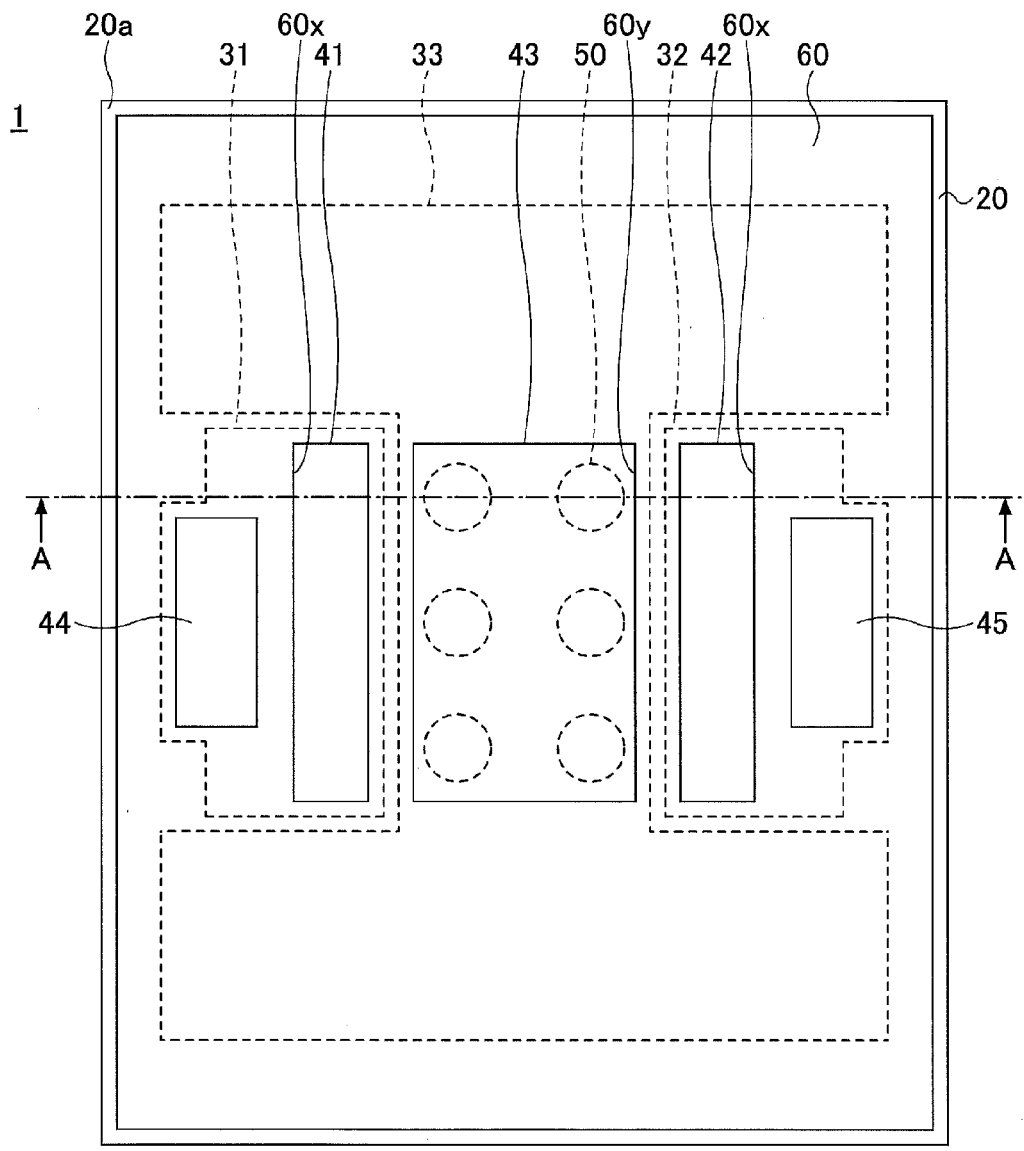

First, a structure of a wiring substrate of a first embodiment is explained. FIG. 1A and FIG. 1B are views illustrating a wiring substrate 1 of the first embodiment. FIG. 1B is a plan view and FIG. 1A is a cross-sectional view taken along an A-A line of FIG. 1B.

With reference to FIG. 1A and FIG. 1B, the wiring substrate 1 basically includes a heat spreader 80, an adhesion layer 70, an insulating layer 10, an adhesion layer 20, wirings 31 to 33, plating films 41 to 45, through wirings 50 and an insulating layer 60. A portion of the wiring substrate 1 including the insulating layer 10, the adhesion layer 20, the wirings 31 to 33, the plating films 41 to 45 and the through wirings 50 is referred to as a "wiring portion Z". This means that the wiring substrate 1 has a structure in which the wiring portion Z is placed on the heat spreader 80 via the adhesion layer 70. Here, the adhesion layer 20 is an optional element and the wiring substrate 1 may not include the adhesion layer 20.

In this embodiment, an insulating layer 60 side of the wiring substrate 1 is referred to as an upper side or one side, and a heat spreader 80 side of the wiring substrate 1 is referred to as a lower side or the other side. Further, a surface of each component at the insulating layer 60 side is referred to as an upper surface or one surface, and a surface at the heat spreader BO side is referred to as a lower surface or the other surface. However, the wiring substrate 1 may be used in an opposite direction or may be used at an arbitrarily angle. Further, in this embodiment, "in a plan view" means that an object is seen in a direction that is normal to one surface of the insulating layer 10, and a "plan shape" means a shape of an object seen in the direction that is normal to the one surface of the insulating layer 10.

In the wiring substrate 1, as the insulating layer 10, a flexible insulating resin film may be used, for example. As the insulating resin film, for example, it is preferable that a film (tape) with a high insulation property such as a polyimide-based resin film, a polyester-based resin film (polyethylene terephthalate film or polyethylene naphthalate film) or the like is used. The thickness of the insulating layer 10 may be about 20 to 100 μm, for example.

The adhesion layer 20 is bonded to one surface of the insulating layer 10 and adheres the wirings 31 to 33 to the insulating layer 10. For the adhesion layer 20, a heat-resistant adhesive agent made of insulating resin such as an epoxy-based adhesive agent, an acrylic-based adhesive agent, a silicone-based adhesive agent, an olefin-based adhesive agent, a polyimide-based adhesive agent or the like may be used, for example. The thickness of the adhesion layer 20 may be about 10 to 200 μm, for example.

The wirings 31 to 33 are provided on the one surface of the insulating layer 10 via the adhesion layer 20, and are electrically insulated from each other. Although not illustrated in FIG. 1A and FIG. 1B, as will be explained later, a semiconductor device such as a light emitting device, a module including the semiconductor device, or the like is to be mounted on the wiring substrate 1. The wirings 31 and 32 are electrical connection wirings that are electrically connected to terminals of the semiconductor device or the like. The wiring 33 is a thermal diffusion wiring that does not affect an operation of the semiconductor device or the like. In other words, the wiring 33 is not electrically connected to the semiconductor device or the like. Yet in other words, current does not flow through the wiring 33. The electrical connection wirings and the thermal diffusion wiring are formed at a same plane on the insulating layer 10. Specifically, in this embodiment, the electrical connection wirings and the thermal diffusion wiring are formed at an upper surface of the adhesion layer 20. The wiring 33 is connected to an end of each of the through wirings 50 that penetrate the insulating layer 10 and the adhesion layer 20. An embodiment in which the semiconductor device is mounted on the wirings 31 to 33 is explained later.

As illustrated in FIG. 1B, the insulating layer 60 is provided with an open portion 60y from which the plating film 43 is exposed. As will be explained later, the semiconductor device or the like or a thermal radiation terminal of the semiconductor device or the like is mounted on the plating film 43 exposed from the open portion 60y. The wiring 33 (thermal diffusion wiring) extends outside of the open portion 60y and is formed to have a larger size than the open portion 60y (in other words, the thermal radiation terminal of the semiconductor device or the like, for example) in a plan view. In other words, the wiring 33 is formed to have a larger size than the wiring 31 or 32 at the upper surface of the insulating layer 10 (or the adhesion layer 20) in a plan view.

For example, in FIG. 1B, the wiring 33 is formed to have an H-shape and to cover the upper surface of the adhesion layer 20 except the areas where the wirings 31 and 32 are formed. Here, the wiring 31 and the wiring 32 are formed at concave portions of the H-shaped wiring 33 such as to face with each other. As such, by extending the wiring 33 to have a larger size, the heat generated at the semiconductor device or the like can be diffused via the wiring 33 in a surface direction of the wiring 33, in addition to via the through wirings 50. Thus, thermal radiation efficiency can be improved.

The plan shape of the wiring 33 is not limited to the H-shape, and the wiring 33 may have various shapes such as a rectangular shape, a polygonal shape, a circular shape, a combined shape of them, or the like in accordance with the shapes or positions of the wirings 31 and 32. In such a case, the wiring 33 may be provided such that a part of the wiring 33 exists between the wiring 31 and the wiring 32 that face with each other. Further, although not illustrated in the drawings, the wiring 33 may be only provided in the vicinity of an area where the plating film 43 is formed (area where the semiconductor device is mounted).

For the material of the wirings 31 to 33, copper (Cu) or the like may be used, for example. The thickness of the wirings 31 to 33 may be about 10 to 150 μm, for example.

The plating films 41 to 43 are formed at portions of the wirings 31 to 33 that are exposed from the upper surface of the insulating layer 60. The plating films 41 to 43 are provided for improving the connection with terminals of a semiconductor device such as a light emitting device or the like. Although not illustrated in FIG. 1A, the wiring 31 includes an area that is one of external connection terminals and the plating film 44 is formed on that area. This means that the plating film 41 and the plating film 44 are electrically connected with each other. Similarly, the wiring 32 includes an area that is another of the external connection terminals and the plating film 45 is provided on that area. This means that the plating film 42 and the plating film 45 are electrically connected with each other. Each of the plating films 41 to 45 may be formed to have a long narrow strip shape, for example, and the plating films 41 to 45 may be aligned to have a predetermined space therebetween.

For the material of the plating films 41 to 45, a plating film in which Ni (or a Ni alloy film) and Au (or an Au alloy film) are stacked in this order may be used, for example. Alternatively, for the material of the plating films 41 to 45, a plating film in which Ni (or a Ni alloy film), Pd (or a Pd alloy film) and Au (or an Au alloy film) are stacked in this order; a plating film in which Ni (or a Ni alloy film), Pd (or a Pd alloy film), Ag (or an Ag alloy film) and Au (or an Au alloy film) are stacked in this order; a plating film of Ag (or an Ag alloy film); a plating film in which Ni (or a Ni alloy film) and Ag (or an Ag alloy film) are stacked in this order; a plating film in which Ni (or a Ni alloy film), Pd (or a Pd alloy film) and Ag (or an Ag alloy film) are stacked in this order; or the like may be used.

Among the plating films 41 to 45, it is preferable that the thickness of each of Au (or the Au alloy film) and Ag (or the Ag alloy film) is more than or equal to 0.1 μm. Further, among the plating films 41 to 45, it is preferable that the thickness of Pd (or the Pd alloy film) is more than or equal to 0.005 μm. Further, among the plating films 41 to 45, it is preferable that the thickness of Ni (or the Ni alloy film) is more than or equal to 0.5 μm. Here, alternatively, without forming the plating films 41 to 45 at portions of the upper surface of the wirings 31 to 33 that are exposed from the insulating layer 60, an anti-oxidant process such as an Organic Solderability Preservative (OSP) process or the like may be performed.

The through wirings 50 are wirings for thermal radiation and are referred to as thermal vias as well. This means that the through wirings 50 function as a part of a path that releases heat generated by the semiconductor device or the like mounted on the wiring substrate 1 when the semiconductor device or the like is operated, to the heat spreader 80 side.

The insulating layer 10 and the adhesion layer 20 are provided with a plurality of through holes that penetrate the insulating layer 10 and the adhesion layer 20 in the thickness direction. The plurality of through wirings 50 are provided to fill the through holes formed in the insulating layer 10 and the adhesion layer 20. The through wirings 50 are provided on the other surface of the wiring 33 (thermal diffusion wiring) at the insulating layer 10 side. Thus, in this embodiment, the plurality of through wirings 50 are provided right below the wiring 33. With this configuration, the thermal radiation property can be improved. For the case illustrated in FIG. 1B, six through wirings 50 are provided, for example.

Further, the through wirings 50 are provided not only at right below the wiring 33 that is exposed from the open portion 60y of the insulating layer 60 (area where the plating film 43 is formed) but also provided at an area of the wiring 33 that is covered by the insulating layer 60. In other words, the plurality of through wirings 50 are provided at the entire area of the wiring 33. For example, as illustrated in FIG. 42, a plurality of the through wirings 50 may be provided.

As such, by providing the plurality of through wirings 50 at the entire area of the wiring 33, the thermal radiation property can be further improved.

This configuration can be adaptable for all of the examples of the embodiments although sometimes the explanation or the illustration of the plurality of through wirings 50 is omitted.

The through wirings 50 are integrally formed with the wiring 33. One end of each of the through wirings 50 is connected to the wiring 33 and the other end of each of the through wirings 50 is exposed from the other surface of the insulating layer 10. Alternatively, the through wirings 50 may be configured such that the other end of each of the through wirings 50 protrudes from the other surface of the insulating layer 10. The plan shape of each of the through wirings 50 may be a circular shape with a diameter of about 0.5 to 1 mm, for example. However, the diameter of each of the through wirings 50 may be more than or equal to 1 mm when it is desired to specifically improve the thermal radiation property or the like. The plan shape of each of the through wirings 50 may be an ellipse shape, a rectangular shape or the like, for example. The thickness of the through wirings 50 may be about 30 to 300 μm, for example. For the material of the through wirings 50, copper (Cu) or the like may be used, for example.

Here, the through wirings 50 are not provided right below the wirings 31 and 32. This means that the wirings 31 and 32 (electrical connection wirings) are only formed to extend on a plane surface (the upper surface of the adhesion layer 20). In other words, only the adhesion layer 20, the insulating layer 10 and the adhesion layer 70 exist between the wirings 31 and 32 and the heat spreader 80, and any other wirings or the like for electrical connection do not exist in the adhesion layer 20, the insulating layer 10 and the adhesion layer 70 at areas overlapping with the wirings 31 and 32, respectively, in a plan view. With this configuration, the insulating properties between the wirings 31 and 32 and the heat spreader 80 can be improved.

When the semiconductor device is a light emitting device, the insulating layer 60 may be a reflection film that is provided on the insulating layer 10 in order to improve reflectivity of light emitted by the light emitting device and to improve thermal diffusivity. The insulating layer 60 is provided with open portions 60x that selectively expose the wirings 31 and 32 (electrical connection wirings) and the open portion 60y as described above that selectively exposes the wiring 33 (thermal diffusion wiring). As described above, the plating films 41 to 45 are provided on the wirings 31 to 33 that are exposed from the insulating layer 60. For the material of the insulating layer 60, epoxy-based resin, silicone-based resin such as organo-polysiloxane or the like, including filler such as titanium oxide ($TiO_2$), barium sulfate ($BaSO_4$) or the like or dye may be used, for example. Alternatively, for the material of the insulating layer 60, white ink made of such a material may be used. The thickness of the insulating layer 60 may be about 20 to 100 μm, for example.

It is preferable that the insulating layer 60 is formed to expose an outer edge portion 20a of the adhesion layer 20. With this configuration, as it is unnecessary to cut the insulating layer 60 when dicing (cutting) and dividing each of the areas, each of which finally becomes the wiring substrate 1, in manufacturing the wiring substrate 1, chipping or removal of an edge of the insulating layer 60 can be prevented. With this, decreasing of a surface area of the insulating layer 60 can be prevented and lowering of reflectivity of the insulating layer 60 can be prevented.

The adhesion layer 70 is provided on the heat spreader 80 and contacts the other surface of the insulating layer 10 to adhere the insulating layer 10 and the heat spreader 80. As the adhesion layer 70 becomes a part of the path that releases the heat transferred from the through wirings 50 to the heat spreader 80, it is preferable that a material whose coefficient of thermal conductivity is high is used for the adhesion layer 70. For the adhesion layer 70, a heat-resistant adhesive agent made of insulating resin such as an epoxy-based adhesive agent, an acrylic-based adhesive agent, a silicone-based adhesive agent, an olefin-based adhesive agent, a polyimide-based adhesive agent or the like including filler such as alumina or the like may be used, for example. The thickness of the adhesion layer 70 may be about 10 to 200 μm, for example. However, in a view point of reducing heat resistance, it is preferable that the thickness of the adhesion layer 70 is thin (about 10 to 50 μm, for example).

The heat spreader 80 is adhered to the other surface of the insulating layer 10 by the adhesion layer 70. For the material of the heat spreader 80, a metal plate made of a material whose coefficient of thermal conductivity is high such as copper (Cu), aluminium (Al), alloy thereof or the like may be used, for example. The thickness of the heat spreader 80 may be about 50 to 2000 µm, for example. However, the thickness of the heat spreader 80 may be about a few millimeter when a particularly high thermal radiation property is required.

A projection portion 91 is provided on an upper surface (on which the adhesion layer 70 is formed) of the heat spreader 80. In this embodiment, the projection portion 91 is provided at substantially the entirety of the upper surface of the heat spreader 80. In this embodiment, the projection portion 91 does not contact the through wirings 50. Specifically, the other end (an end surface at the adhesion layer 70 side) of each of the through wirings 50 and a front end (front surface) of the projection portion 91 are spaced apart from each other and the adhesion layer 70 exists therebetween. As the other end of each of the through wirings 50 and the front end of the projection portion 91 are apart from each other, insulation between the through wirings 50 and the heat spreader 80 can be ensured. Thus, lowering of the insulation property due to an influence of excitation of the voltage can be prevented. A cross-sectional shape of the projection portion 91 may be an arbitrary shape such as a trigonal shape, a rectangular shape, a trapezoid shape, a semicircular shape, a semi-ellipse shape or the like. The height of the projection portion 91 may be about 10 to 100 µm, for example. The projection portion 91 is explained in detail with reference to FIG. 2.

Figure 2:
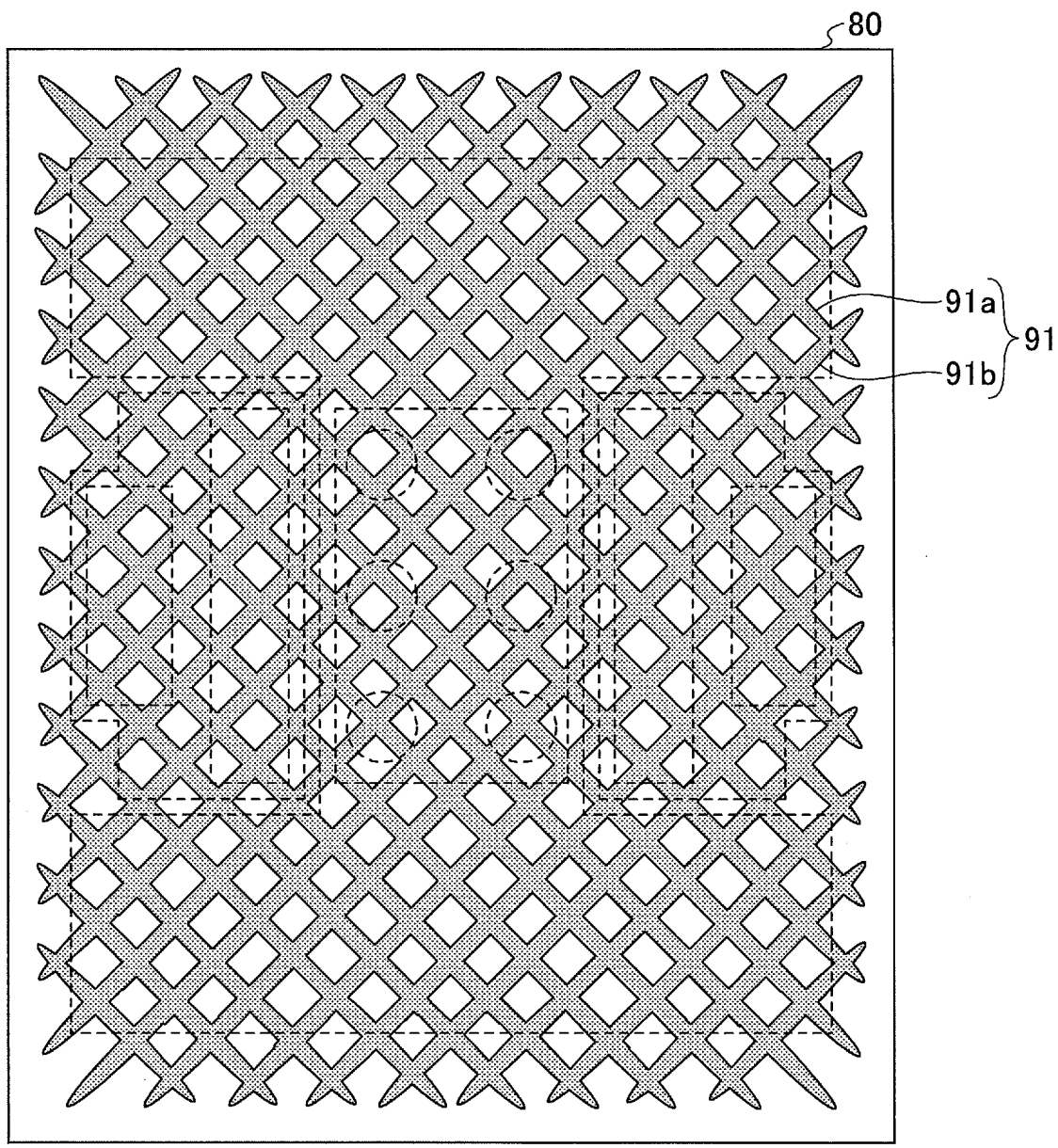
FIG. 2 is a plan view illustrating an example of a projection portion provided at a heat spreader of the wiring substrate of the first embodiment.

FIG. 2 is a plan view illustrating an example of the projection portion 91 provided at the heat spreader 80 of the wiring substrate 1 of the first embodiment. Although FIG. 2 is a view illustrating the heat spreader 80 and the projection portion 91, in order to facilitate understanding of the positional relationship between the through wirings 50 and the like, the through wirings 50 and the like are expressed by dotted lines for explanation purposes (reference numerals are omitted).

Different from random concavo-convex portions formed by abrasive blasting or the like, the projection portion 91 is formed to have a certain regularity by press working or the like. In this embodiment, as illustrated in FIG. 2, the projection portion 91 is formed in a mesh-form (reticulated pattern) on the upper surface of the heat spreader 80.

Specifically, the projection portion 91 includes a plurality of linear projection portions 91a that are aligned in substantially parallel with each other with a predetermined space therebetween and a plurality of linear projection portions 91b that are aligned in substantially parallel with each other with a predetermined space therebetween. Here, the linear projection portions 91a are provided to be oblique to one of sides of the upper surface of the heat spreader 80. The linear projection portions 91b are provided to cross (be perpendicular with respect to, for example) the linear projection portions 91a. The projection portion 91 is placed (exists) at least at an area that overlaps the through wirings 50 in a plan view.

Although the linear projection portions 91a and the linear projection portions 91b are given different reference numerals, the linear projection portions 91a and the linear projection portions 91b are integrally formed by press working or the like to constitute the projection portion 91. The width of each of the linear projection portions 91a and 91b may be about 10 to 100 µm, for example. The space between the adjacent linear projection portions 91a and 91b may be about 10 to 100 µm, for example.

The projection portion 91 is integrally formed with the heat spreader 80. This means that the composition of the projection portion 91 is the same as the composition of the heat spreader 80. The projection portion 91 is made of a metal whose coefficient of thermal conductivity is high such as copper (Cu), aluminium (Al), alloy thereof or the like, for example. The adhesion layer 70 directly contacts a metal surface that composes the surface of the projection portion 91.

As such, by forming the projection portion 91 at least at the area of the upper surface of the heat spreader 80 that overlaps the through wirings 50 in a plan view, a physical distance between the through wirings 50 and the heat spreader 80 can be shortened, and thus the heat resistance can be lowered and the thermal radiation property can be improved. Further, as the effective area of the bonding interface of the adhesion layer 70 and the heat spreader 80 becomes larger, the adhesion property of the adhesion layer 70 and the heat spreader 80 can be improved.

An advantage of a structure of the embodiment in which the through wirings 50 are not provided right below the wirings 31 and 32 and the through wirings 50 are only provided right below the wiring 33 is explained. If the through wirings 50 are provided right below the wirings 31 and 32, the other end of each of the through wirings 50 that exposes from the other surface of the insulating layer 10 faces the heat spreader 80 via the adhesion layer 70 including filler such as alumina or the like. As the wirings 31 and 32 are the electrical connection wirings, in particular, when the thickness of the adhesion layer 70 is thin (about 10 to 50 µm, for example), leakage may occur from the through wirings 50 to the heat spreader 80 via the adhesion layer 70 to lower the insulating property.

Thus in order to provide the through wirings 50 right below the wirings 31 and 32, it is necessary to make the adhesion layer 70 thick to a certain extent (about 100 to 200 µm, for example) to ensure the insulating property. However, the adhesion layer 70 functions as a part of a thermal radiation path between the through wirings 50 and the heat spreader 80. Thus, if the adhesion layer 70 is made thick in order to ensure the insulating property, heat resistance increases and the thermal radiation property is lowered. Thus, it is difficult to ensure the insulating property and the thermal radiation property at the same time when the through wirings 50 are provided right below the wirings 31 and 32.

On the other hand, according to the present embodiment, as the through wirings 50 are not provided right below the wirings 31 and 32, there is no risk of lowering of the insulating property even when the adhesion layer 70 is made thin (about 10 to 50 µm, for example) to lower heat resistance. Further, although the through wirings 50 are provided right below the wiring 33, the wiring 33 is the thermal diffusion wiring and is not electrically connected to the semiconductor device or the like that is mounted on the wiring substrate 1 and current does not flow through the wiring 33. Thus, even when the other end of each of the through wirings 50 faces the heat spreader 80 via the relatively thin adhesion layer 70 (about 10 to 50 µm, for example), leakage does not occur.

As described above, a material with a high insulation property such as polyimide or the like is used as the insulating layer 10. Further, the through wirings 50 are not provided right below the wirings 31 and 32, and the through wirings 50 are only provided right below the wiring 33 that is for thermal radiation and through which current does not flow. With this configuration, the insulation property can be ensured. Further, as the insulation property can be ensured by the above configuration, it is possible to use the relatively thin adhesion layer 70.

Further, by forming the projection portion 91 at least at the area of the upper surface of the heat spreader 80 that overlaps the through wirings 50 in a plan view, a physical distance between the through wirings 50 and the heat spreader 80 can be shortened. Thus, the heat resistance can be lowered and the thermal radiation property can be improved. In other words, a wiring substrate in which the insulation property is ensured while improving the thermal radiation property can be provided.

Further, the adhesion layer 70 including filler and with a high coefficient of thermal conductivity directly contacts the metal surface that composes the surface of the projection portion 91 and the metal surface that composes the upper surface of the heat spreader 80 without providing another layer such as an oxide film or the like between the upper surface of the heat spreader 80 and the lower surface of the adhesion layer 70. Thus, the heat resistance can be lowered and the thermal radiation property can be improved.

Here, when providing the projection portion 91 at substantially the entirety of the upper surface of the heat spreader 80, the physical distances between the wirings 31 and 32 and the heat spreader 80 are also shortened. However, as a material with a high insulation property such as polyimide or the like is used as the insulating layer 10, the insulation property is not lowered.

(Method of Manufacturing Wiring Substrate of First Embodiment)

Next, a method of manufacturing the wiring substrate 1 of the first embodiment is explained. FIG. 3A to FIG. 7E are views illustrating an example of a method of manufacturing the wiring substrate 1 of the first embodiment. The cross-sectional views used for explaining the method of manufacturing the wiring substrate 1 of the first embodiment correspond to FIG. 1A.

Figure 3A:
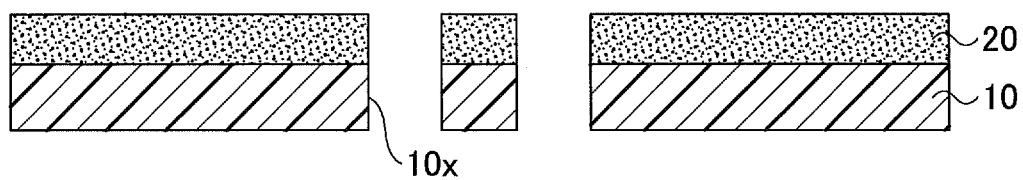
FIG. 3A to FIG. 3C are views illustrating an example of a manufacturing step of the wiring substrate of the first embodiment.

First, in a step illustrated in FIG. 3A, a polyimide film in a reel form (or tape form) is prepared as the insulating layer 10, for example. Then, the adhesion layer 20 is formed on the one surface of the insulating layer 10 by coating an epoxy-based adhesive agent or the like. Alternatively, instead of coating the epoxy-based adhesive agent or the like, the adhesion layer 20 may be formed by adhering an epoxy-based adhesive film on the one surface of the insulating layer 10. Then, the insulating layer 10 and the adhesion layer 20 are provided with through holes 10x that penetrate the insulating layer 10 and the adhesion layer 20. The through holes 10x may be formed by punching, for example. Here, although the insulating layer 10 or the like has a plurality of areas of which each becomes the wiring substrate 1, only one of the areas that becomes the wiring substrate 1 is explained in the following.

Figure 3B:
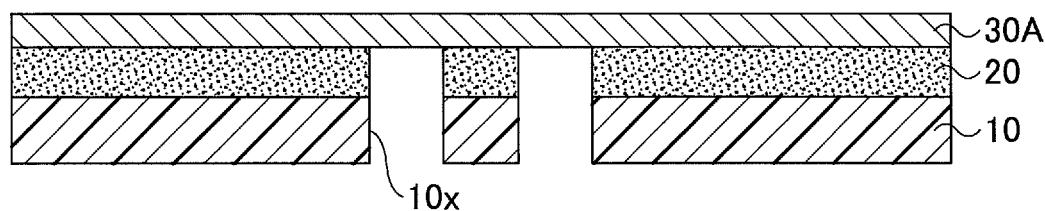

Next, in a step illustrated in FIG. 3B, a metal layer 30A is formed on the adhesion layer 20. The metal layer 30A finally becomes the wirings 31 to 33 after being patterned. Then, the adhesion layer 20 is cured by heating to a predetermined temperature. The metal layer 30A may be formed by laminating a copper film on the adhesion layer 20, for example. The thickness of the metal layer 30A may be about 10 to 150 μm, for example. Thereafter, an upper surface of the metal layer 30A and a lower surface of the metal layer 30A exposed in each of the through holes 10x are etched (so-called soft etching) by immersing the structure illustrated in FIG. 3B in wet etching solution (hydrogen peroxide-based solution, for example). By this etching process, rust-inhibitor that exists at the surfaces of the metal layer 30A is removed and the surfaces of the metal layer 30A are also slightly (about 0.5 to 1 μm, for example) removed. This etching process is not essentially performed and may be performed in accordance with necessity.

Figure 3C:
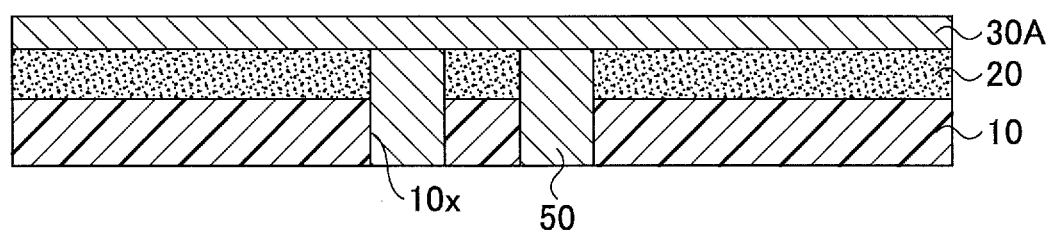

Next, in a step illustrated in FIG. 3C, the through wirings 50 that are integrally connected to the metal layer 30A are formed in the through holes 10x, respectively. Specifically, first, a masking tape is adhered to the upper surface of the metal layer 30A. The masking tape is provided to cover the upper surface of the metal layer 30A in order to prevent generation of a plating film at the upper surface of the metal layer 30A when forming the through wirings 50 by electroplating.

After adhering the masking tape, the through wirings 50 are formed by electroplating using the metal layer 30A as a power supply layer. Then, the masking tape is removed. The through wirings 50 are formed by depositing plating metal at the lower surface of the metal layer 30A that is exposed in each of the through holes 10x and filling the plating metal in each of the through holes 10x. Each of the through wirings 50 is formed to have a columnar shape. Each of the through wirings 50 is formed such that one end (an upper end in FIG. 3C) is connected to the metal layer 30A and the other end (a lower end in FIG. 3C) is exposed from the other surface of the insulating layer 10.

The other end of the through wiring 50 may be flush with the other surface of the insulating layer 10, or may be protruded from the other surface of the insulating layer 10. When the other end of the through wiring 50 is flush with the other surface of the insulating layer 10, the thickness of the wiring portion Z can be made thinner and evenness of the wiring portion Z when being bonded to the heat spreader 80 can be ensured. When the other end of the through wiring 50 is protruded from the other surface of the insulating layer 10, surface area can be increased due to the protrusion and thermal radiation property can be improved. For the material of the through wirings 50, copper (Cu) or the like may be used, for example.

Figure 4A:
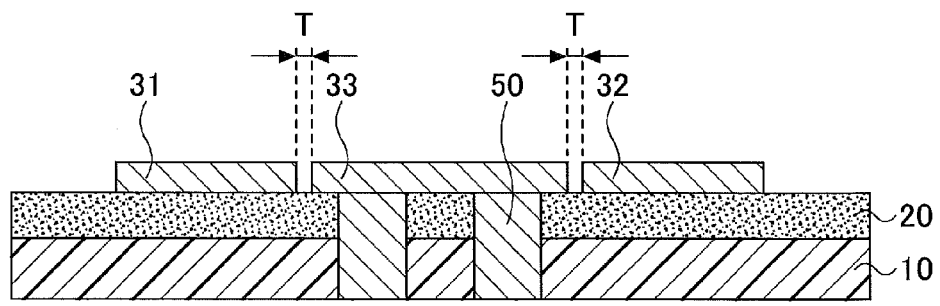
FIG. 4A and FIG. 4B are views illustrating an example of a manufacturing step of the wiring substrate of the first embodiment.
Figure 4B:
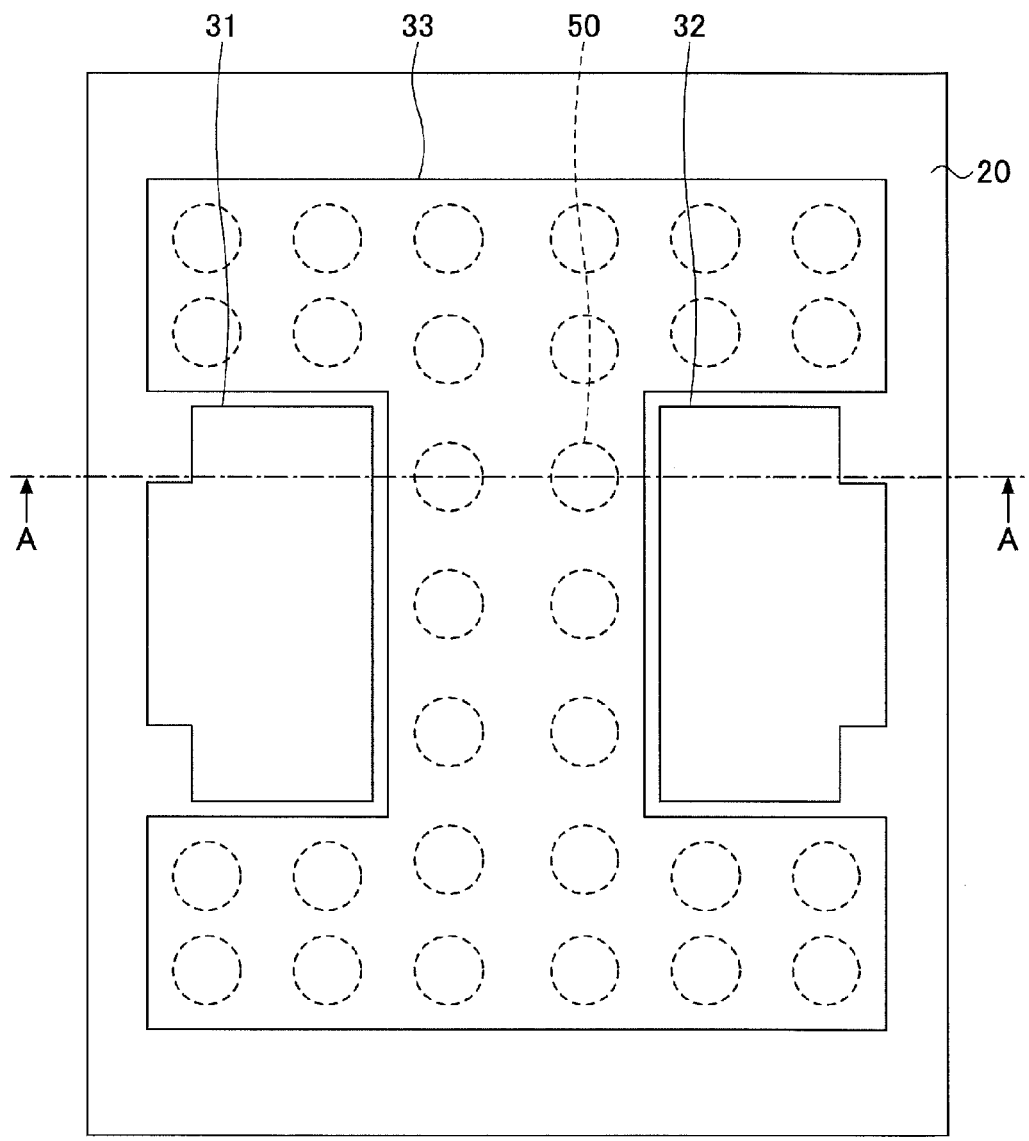

Next, in a step illustrated in FIG. 4A and FIG. 4B (FIG. 4B is a plan view and FIG. 4A is a cross-sectional view taken along an A-A line in FIG. 4B), the metal layer 30A is patterned to be formed into the wirings 31 to 33. Further, although not illustrated in the drawings, a bus line connected to the wirings 31 to 33 is also formed with the wirings 31 to 33. The bus line is used for forming the plating films 41 to 45 by electroplating in the following process. Specifically, the wirings 31 to 33 are formed by coating resist (not illustrated in the drawings) on the metal layer 30A and exposing and developing the resist to have a pattern corresponding to the wirings 31 to 33 and the bus line, for example. Then, the metal layer 30A is etched (patterned) using the resist to be the wirings 31 to 33 and the bus line. Thereafter, the resist is removed.

At this time, if a space T between the wiring 33 and the wiring 31 or 32 is narrow, when voltage is applied to the wiring 31 or 32, opposite voltage is induced on the wiring 33, that is in the vicinity of the wiring 31 or 32. In such a case, there is a possibility that insulation reliability between the wiring 33 and the heat spreader 80 is reduced. Thus, it is preferable that the space T between the wiring 33 and the wiring 31 or 32 is sufficiently wide so that voltage is not induced on the wiring 33.

Figure 5A:
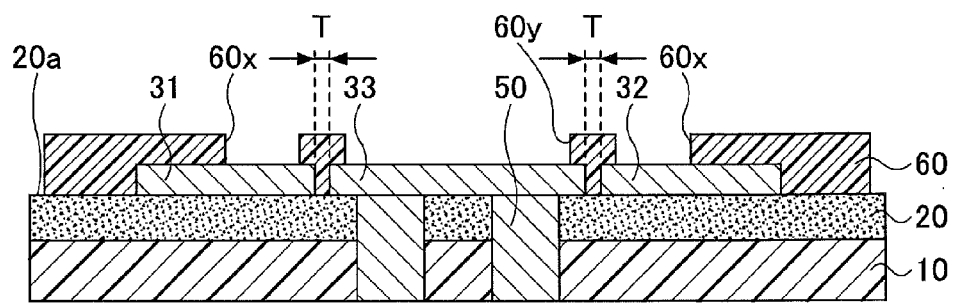
FIG. 5A and FIG. 5B are views illustrating an example of a manufacturing step of the wiring substrate of the first embodiment.
Figure 5B:
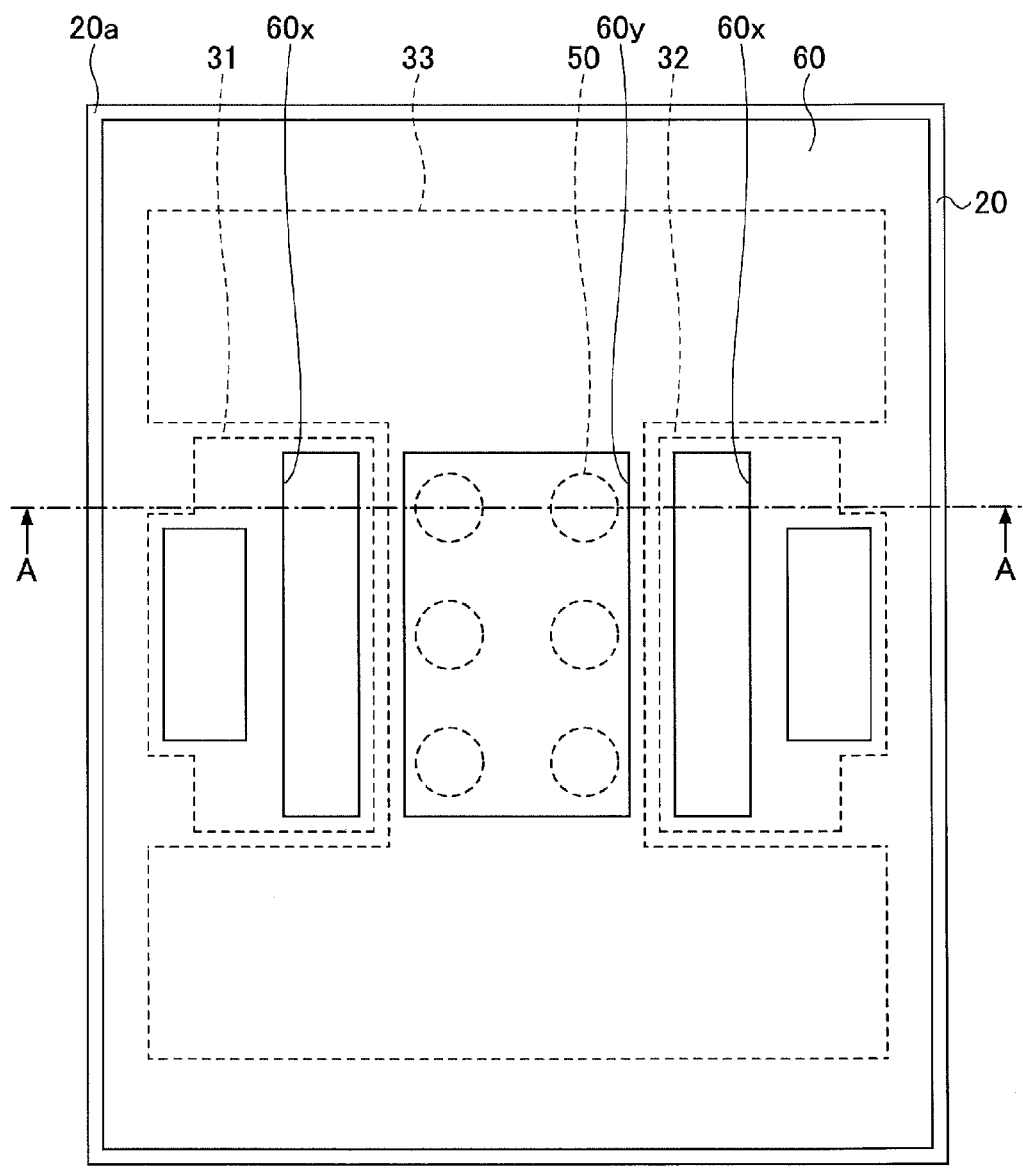

Next, in a step illustrated in FIG. 5A and FIG. 5B (FIG. 5B is a plan view and FIG. 5A is a cross-sectional view taken along an A-A line in FIG. 5B), the insulating layer 60 (reflection film) that selectively exposes the wirings 31 to 33 is formed. In other words, the insulating layer 60 is formed to expose portions where the plating films 41 to 45 are formed. Specifically, the insulating layer 60 is formed to be provided with the open portions 60x that selectively expose the wirings 31 and 32 (electrical connection wiring) and the open portion 60y that selectively exposes the wiring 33 (thermal diffusion wiring).

Further, the insulating layer 60 is formed to fill the space T between the wiring 31 and the wiring 33, and the space T between the wiring 32 and the wiring 33. By forming the insulating layer 60 between the wirings 31 and 32 (electrical connection wiring) and the wiring 33 (thermal diffusion wiring), the insulating property and reflection efficiency can be improved.

For the material of the insulating layer 60, a white-based material may be used, as described above. The insulating layer 60 may be formed by screen printing or the like, for example. Alternatively, the insulating layer 60 may be formed by forming white ink or the like to cover the entirety of the wirings 31 to 33, and then exposing portions where the plating films 41 to 45 are formed by photolithography, blasting, laser processing or the like.

Here, it is preferable that the insulating layer 60 is formed to expose the outer edge portion 20a of the adhesion layer 20 in each of the areas that becomes the wiring substrate 1. With this configuration, as it is unnecessary to cut the insulating layer 60 when dicing (cutting) and dividing each of the areas, each of which finally becomes the wiring substrate 1, chipping or removal of an edge of the insulating layer 60 can be prevented. With this, decreasing of a surface area of the insulating layer 60 can be prevented and lowering of reflectivity of the insulating layer can be prevented. Alternatively, the insulating layer 60 may be provided not to expose the outer edge portion 20a in accordance with necessity (see FIG. 7D, for example).

Figure 6A:
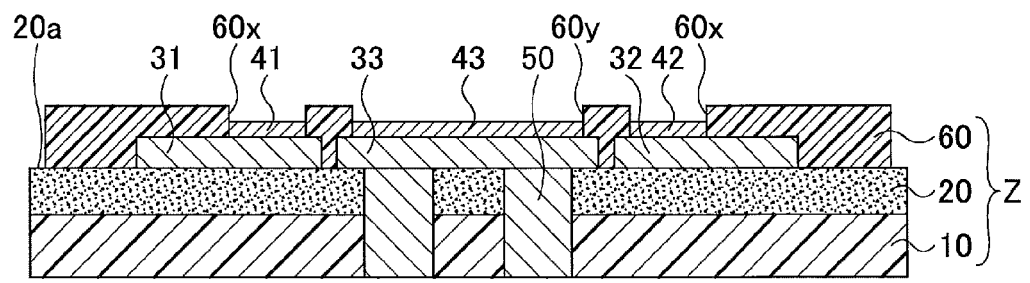
FIG. 6A and FIG. 6B are views illustrating an example of a manufacturing step of the wiring substrate of the first embodiment.
Figure 6B:
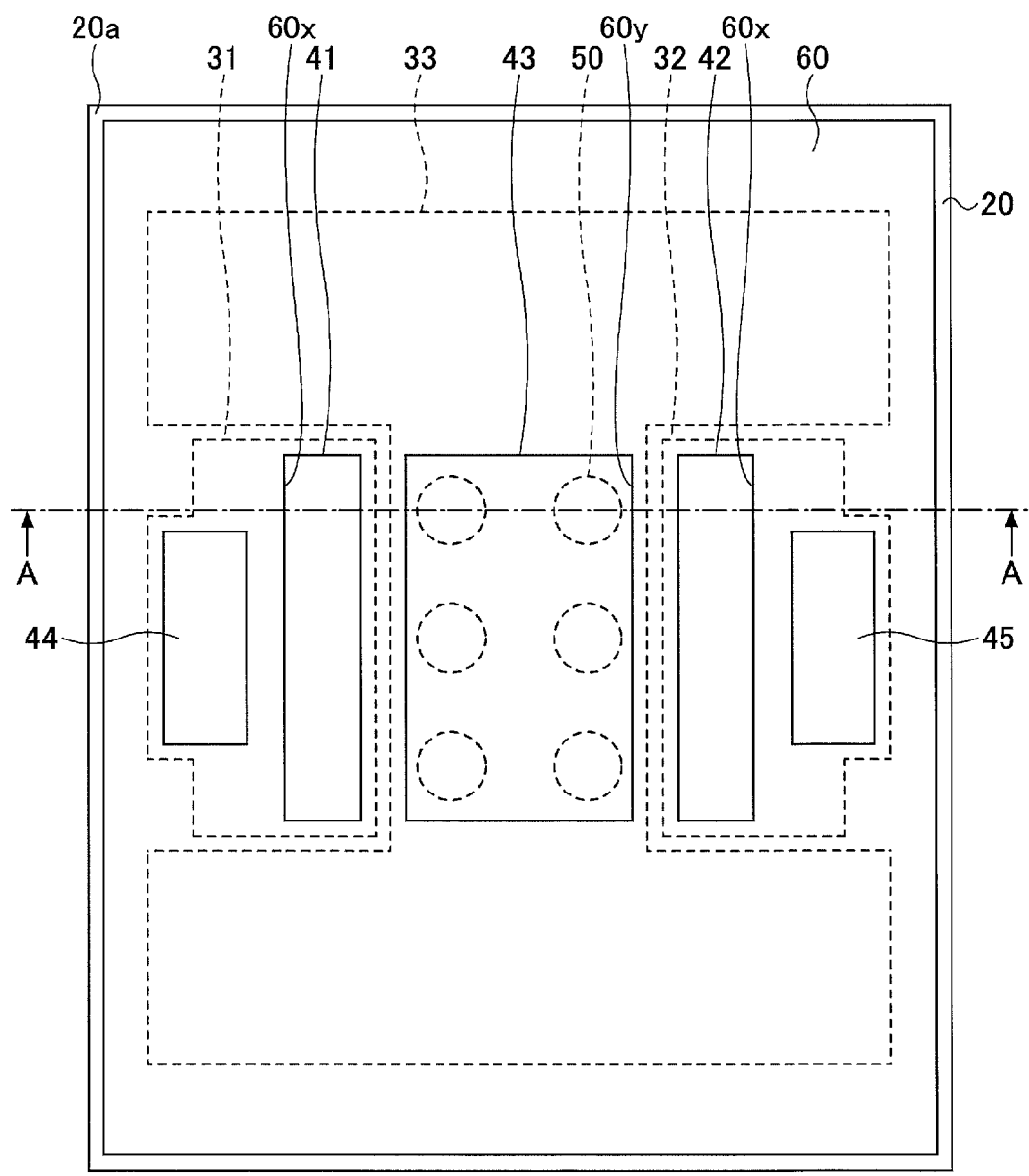

Next, in a step illustrated in FIG. 6A and FIG. 6B (FIG. 6B is a plan view and FIG. 6A is a cross-sectional view taken along an A-A line in FIG. 6B), the plating films 41 to 45 are formed on the wirings 31 to 33 by electroplating. Specifically, for example, a masking tape is adhered to the other surface of the insulating layer 10. Then, electroplating is performed using an electric power supply path including the bus line connected to the wirings 31 to 33 to form the plating films 41 to 45 at the upper surfaces of the wirings 31 to 33 that are exposed from the insulating layer 60. Thereafter, the masking tape is removed. The material, the thickness and the like of each of the plating films 41 to 45 are as described above.

Next, an outer edge portion (parts of the insulating layer 10, the adhesion layer 20 or the like that are exposed from the insulating layer 60) of the structure illustrated in FIG. 6A and FIG. 6B is cut and divided by press working, numerical control machining, laser processing or the like to form a plurality of the wiring portions Z of the wiring substrates 1. At this time, the bus line connected to the wirings 31 to 33 is cut at the same time.

Next, the projection portion 91 as illustrated in FIG. 1A and FIG. 2 is formed on the upper surface of the heat spreader 80. The projection portion 91 can be easily made into a desired shape by press working or the like, for example. Thus, variations of the height (projection amount), the formed density or the like of the projection portion 91 between products can be suppressed. Next, the divided wiring portion Z is bonded to the heat spreader 80, at which the projection portion 91 is formed, via the adhesion layer 70. At this time, due to the existence of the projection portion 91, effective area of a bonding interface of the adhesion layer 70 and the heat spreader 80 becomes large. Thus, the adhesion layer 70 and the heat spreader BO can be bonded with a good adhesion property.

Specifically, the adhesion layer 70 that covers the projection portion 91 is formed by adhering a thermosetting epoxy-based adhesive film or the like including filler such as alumina or the like on the upper surface of the heat spreader 80, for example. Then, the divided structure is placed on the adhesion layer 70. Then, the divided structure is pressed toward the heat spreader 80 side while heating at predetermined temperature to cure the adhesion layer 70. Alternatively, the adhesion layer 70 may be formed by coating liquid or paste of thermosetting epoxy-based resin including filler such as alumina or the like on the heat spreader 80 by spin coating, for example. With the above steps, a plurality of the wiring substrates 1 (see FIG. 1A and FIG. 1B) are formed.

Although the divided structure (wiring portion Z) is bonded to the heat spreader 80 via the adhesion layer 70 in the above described method, this is not limited so. For example, the adhesion layer 70 may be formed on the structure (wiring portion Z) in which the bus line is cut, and then, the structure (wiring portion Z) and the adhesion layer 70 may be divided. Next, the divided structure (wiring portion Z and the adhesion layer 70) may be stacked on the heat spreader 80, at which the projection portion 91 is formed, by applying pressure at a predetermined temperature. Further, the wiring portion Z may be divided with the adhesion layer 70 and the heat spreader 80 after being bonded to the heat spreader 80 via the adhesion layer 70, for example.

Here, instead of the steps illustrated in FIG. 4A to FIG. 6B, steps illustrated in FIG. 7A to FIG. 7E may be used. First, in a step illustrated in FIG. 7A, similar to the step illustrated in FIG. 4A and FIG. 4B, the wirings 31 to 33 and the bus lines (not illustrated in the drawings) connected to the wirings 31 to 33 are formed by patterning the metal layer 30A.

Figure 7A:
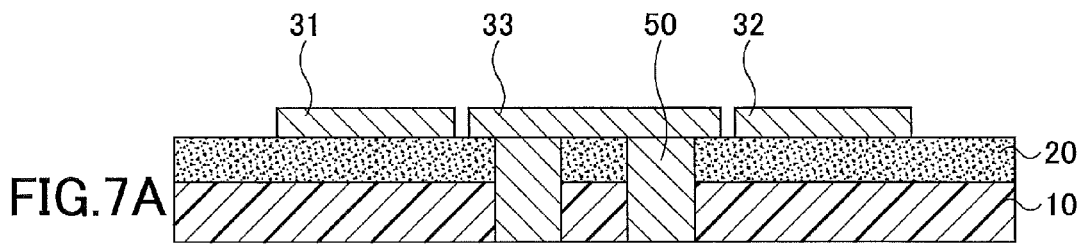
FIG. 7A to FIG. 7E are views illustrating an example of a manufacturing step of the wiring substrate of the first embodiment.
Figure 7B:
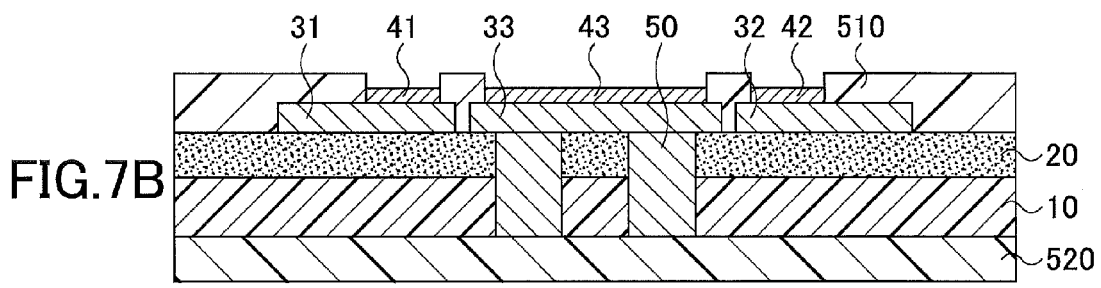
Figure 7C:
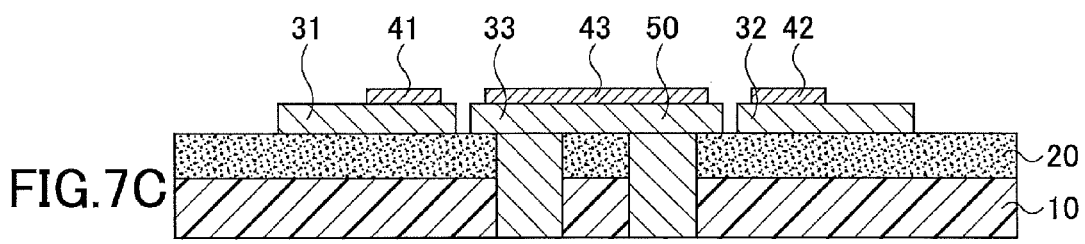

Next, in a step illustrated in FIG. 7B, the plating films 41 to 45 are formed on the wirings 31 to 33 by electroplating. Specifically, a resist film 510 that selectively exposes predetermined portions (portions where the plating films 41 to 45 are formed in FIG. 1A and FIG. 1B) of the upper surface of the wirings 31 to 33 is formed on the adhesion layer 20, for example. Further, a masking tape 520 is adhered to the other surface of the insulating layer 10. Then, the plating films 41 to 45 are formed on the portions of the upper surface of the wirings 31 to 33 that are exposed from the resist film 510 by performing electroplating using an electric power supply path including the bus line connected to the wirings 31 to 33. The material, the thickness and the like of the plating films 41 to 45 are as explained above. Next, in a step illustrated in FIG. 7C, the resist film 510 and the masking tape 520 are removed.

Figure 7D:
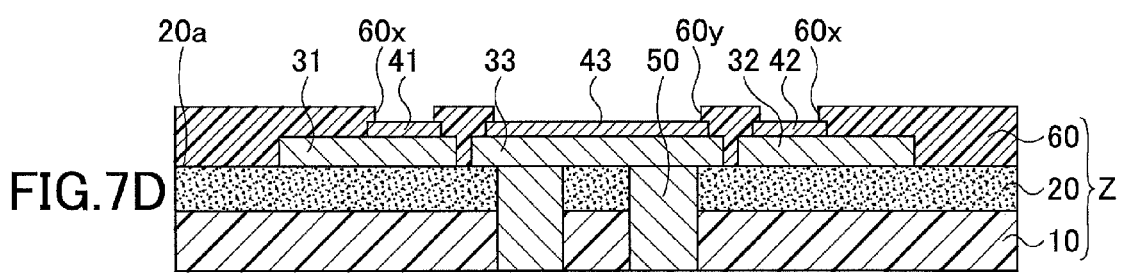

Next, in a step illustrated in FIG. 7D, similar to the step illustrated in FIG. 5A and FIG. 53, the insulating layer 60 is formed on the predetermined portions (such as to expose the portions of the plating films 41 to 45 except their outer edge portions, for example) of the wirings 31 to 33. In FIG. 7D, an example is illustrated in which the insulating layer 60 is provided such that the outer edge portion 20a of the adhesion layer 20 is not exposed.

Figure 7E:
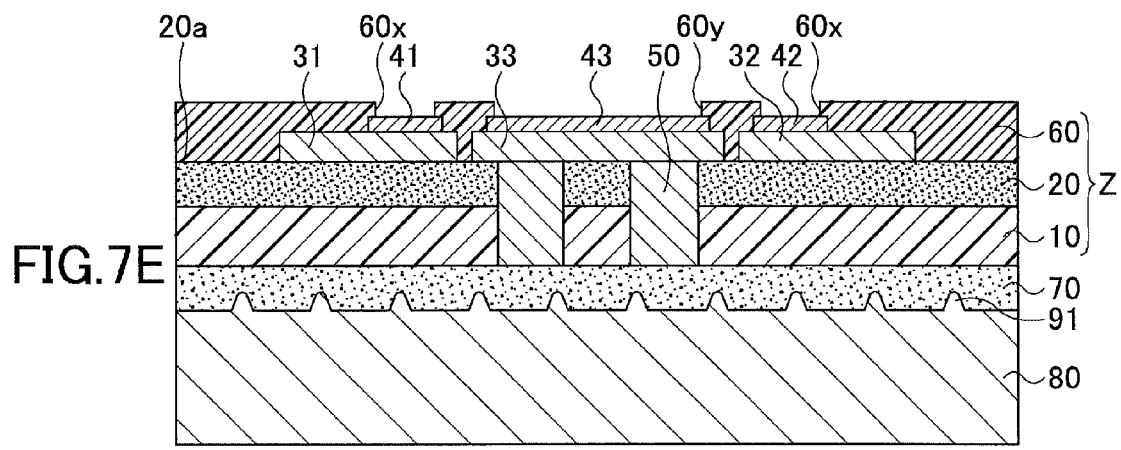

Finally, in a step illustrated in FIG. 7E, the outer edge portion of the structure illustrated in FIG. 7D is cut and divided by press working or the like. Then, the divided structure is adhered to the heat spreader 80, at which the projection portion 91 is formed, via the adhesion layer 70. With the above steps, a plurality of the wiring substrates 1 are formed.

Alternative Example 1 of the First Embodiment

In an alternative example 1 of the first embodiment, an example is explained in which the projection portion is provided at only a part of the upper surface of the heat spreader. In the alternative example 1 of the first embodiment, the components same as those explained above are given the same reference numerals, and explanations are not repeated.

Figure 8A:
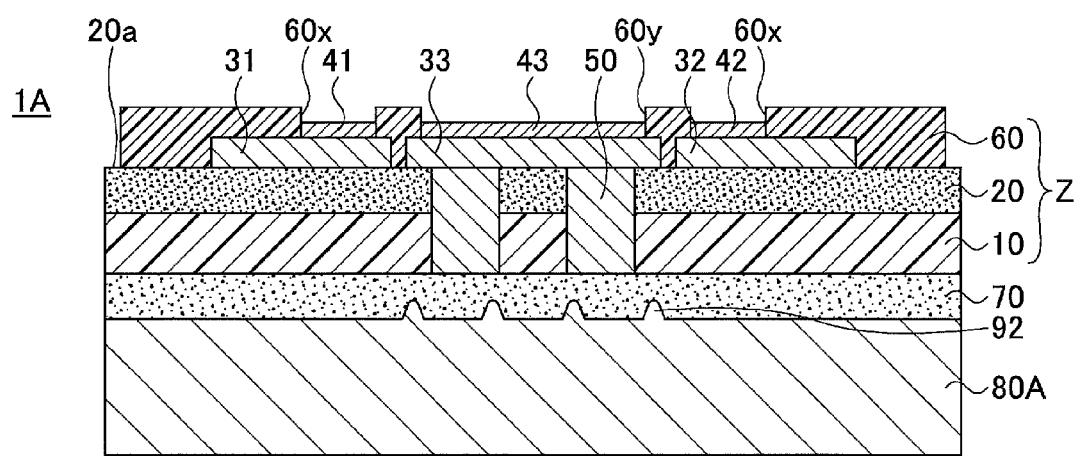
FIG. 8A and FIG. 8B are views illustrating an example of an alternative example 1 of the first embodiment.
Figure 8B:
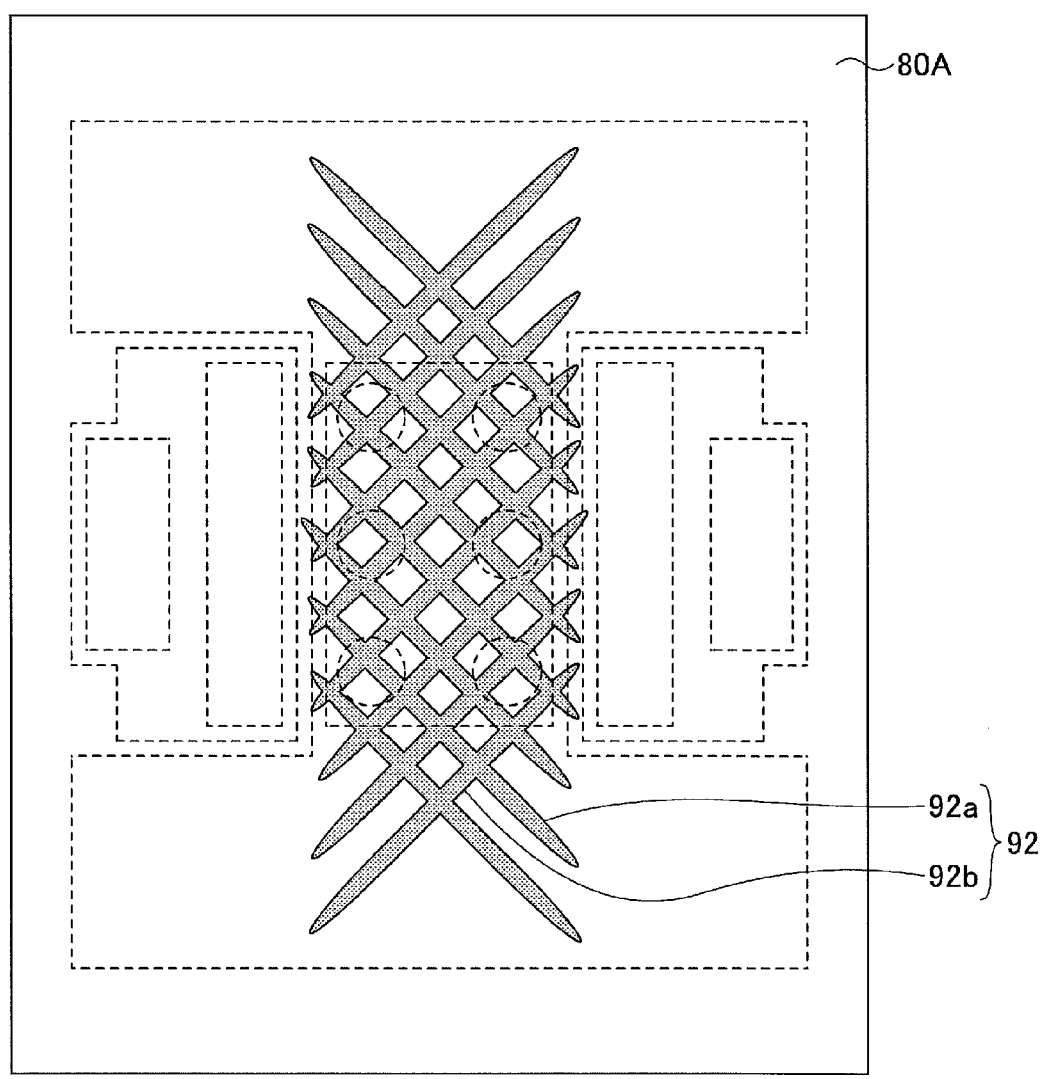

FIG. 8A is a cross-sectional view illustrating an example of a wiring substrate 1A of an alternative example 1 of the first embodiment. Although FIG. 8B is a view illustrating the heat spreader 80A and a projection portion 92 in the wiring substrate 1A of the alternative example 1, in order to facilitate understanding of the positional relationship between the through wirings 50 and the like, the through wirings 50 and the like are expressed by dotted lines for explanation purposes (reference numerals are omitted).

In the wiring substrate 1, the projection portion 91 is provided at substantially the entirety of the upper surface of the heat spreader 80. However, as illustrated in FIG. 8A and FIG. 8B, in the wiring substrate 1A, the projection portion 92 is only provided in the vicinity of an area of the upper surface of the heat spreader 80A below the through wirings 50. In this embodiment, the projection portion 92 does not contact the through wirings 50. The height of the projection portion 92 may be about 10 to 100 μm, for example. The height or the cross-sectional shape of the projection portion 92 may be the same as that of the projection portion 91, for example.

Different from random concavo-convex portions formed by abrasive blasting or the like, the projection portion 92 is formed to have a certain regularity by press working or the like. In this embodiment, as illustrated in FIG. 8B, the projection portion 92 is formed in a mesh-form (reticulated pattern) on a part of the upper surface of the heat spreader 80A. Linear projection portions 92*a* and 92*b* are similar to the linear projection portions 91*a* and 91*b* but the lengths are short. The width of each of the linear projection portions 92*a* and 92*b* or the space between the adjacent linear projection portions 92*a* and 92*b* may be the same as that of the linear projection portions 91*a* and 91*b*, for example.

The projection portion 92 is integrally formed with the heat spreader 80A. This means that the composition of the projection portion 92 is the same as the composition of the heat spreader 80A. The projection portion 92 is made of a metal whose coefficient of thermal conductivity is high such as copper (Cu), aluminium (Al), alloy thereof or the like, for example. The adhesion layer 70 directly contacts a metal surface that composes the surface of the projection portion 92.

As such, the projection portion 92 may be only provided in the vicinity of the area (the area that overlaps the through wirings 50 in a plan view) of the upper surface of the heat spreader 80A below the through wirings 50, that is a main radiation path. In this case as well, as the physical distance between the through wirings 50 and the heat spreader BOA is shortened, the heat resistance can be lowered and the thermal radiation property can be improved. Here, the effect of ensuring the insulation property is the same as that of the first embodiment.

Alternative Example 2 of First Embodiment

In an alternative example 2 of the first embodiment, an example is explained in which the projection portion having a plan shape different from that of the alternative example 1 of the first embodiment is provided. In the alternative example 2 of the first embodiment, the components same as those explained above are given the same reference numerals, and explanations are not repeated.

Figure 9:
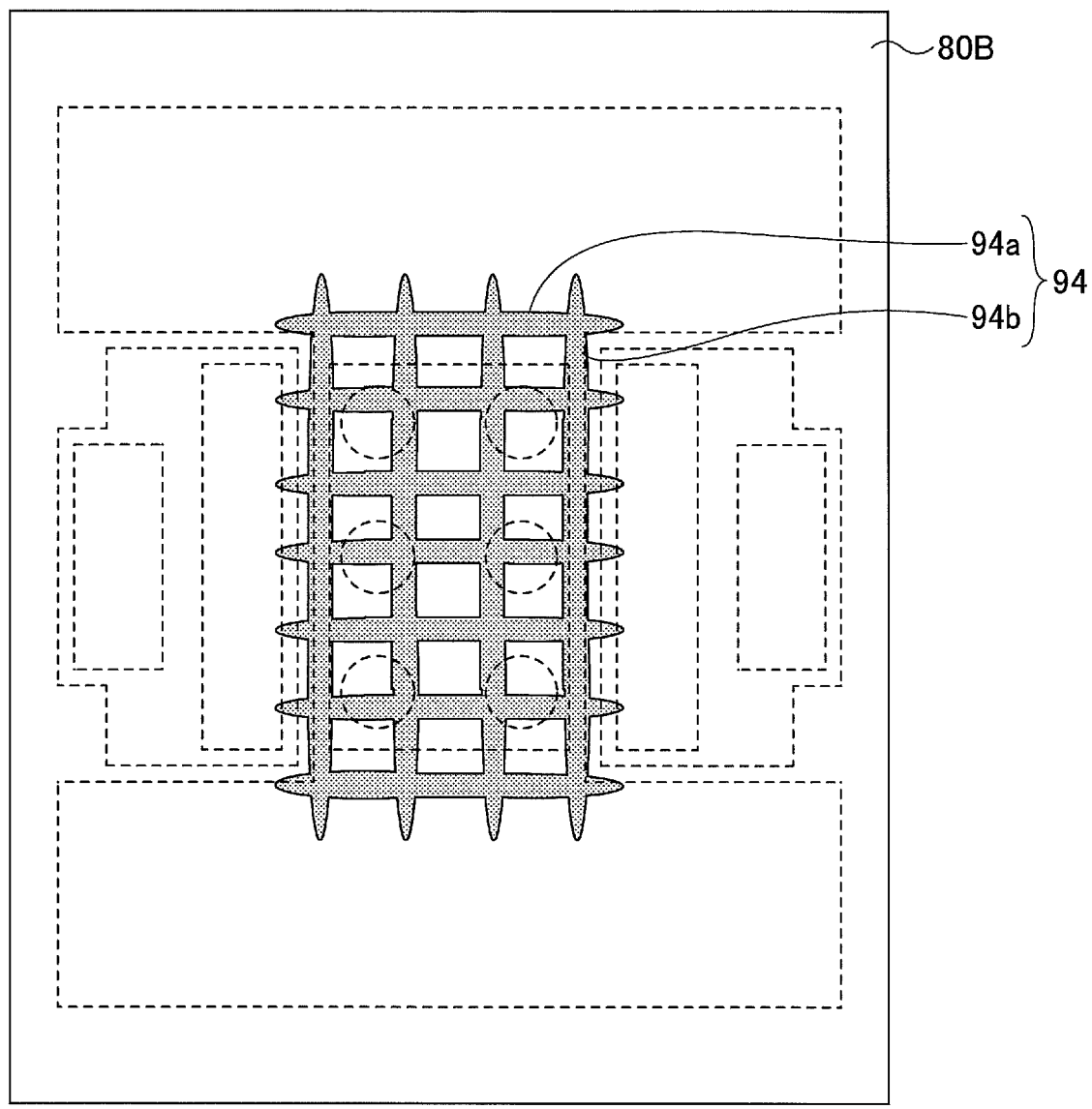
FIG. 9 is a view illustrating an example of the wiring substrate of an alternative example 2 of the first embodiment.

In the alternative example 2 of the first embodiment, a cross-sectional view of a wiring substrate 1B is similar to that illustrated in FIG. 8A, and thus is omitted. Although FIG. 9 is a view illustrating a heat spreader 80B and a projection portion 94 of the alternative example 2 of the first embodiment, in order to facilitate understanding of the positional relationship between the through wirings 50 and the like, the through wirings 50 and the like are expressed by dotted lines for explanation purposes (reference numerals are omitted).

In the wiring substrate 1A, the projection portion 92 including the linear projection portions 92*a* and 92*b*, that are provided to be oblique to one of sides of the upper surface of the heat spreader 80A, is provided in the vicinity of an area of the upper surface of the heat spreader 80A below the through wirings 50. However, as illustrated in FIG. 9, in the wiring substrate 1B, the projection portion 94 including a plurality of linear projection portions 94*a* and 94*b*, that are provided in a substantially parallel relationship with one of sides of the upper surface of the heat spreader 80B, is provided in the vicinity of an area of the upper surface of the heat spreader BOB below the through wirings 50. In this embodiment, the projection portion 94 does not contact the through wirings 50. The height or the cross-sectional shape of the projection portion 94 may be the same as that of the projection portion 92, for example.

Different from random concavo-convex portions formed by abrasive blasting or the like, the projection portion 94 is formed to have a certain regularity by press working or the like. In this embodiment, as illustrated in FIG. 9, the projection portion 94 is formed in a mesh-form (reticulated pattern) on a part of the upper surface of the heat spreader BOB.

Specifically, the projection portion 94 includes the plurality of linear projection portions 94*a* that are aligned in substantially parallel with each other with a predetermined space therebetween and the plurality of linear projection portions 94*b* that are aligned in substantially parallel with each other with a predetermined space therebetween. Here, the linear projection portions 94*a* are provided to be in parallel to one of sides of the upper surface of the heat spreader 80B. The linear projection portions 94*b* are provided to cross (be perpendicular with respect to, for example) the linear projection portions 94*a*. The projection portion 94 is placed (exists) at least at an area that overlaps the through wirings 50 in a plan view. The width of each of the linear projection portions 94*a* and 94*b* or the space between the adjacent linear projection portions 94*a* and 94*b* may be the same as that of the linear projection portions 92*a* and 92*b*, for example.

The projection portion 94 is integrally formed with the heat spreader 80B. This means that the composition of the projection portion 94 is the same as the composition of the heat spreader BOB. The projection portion 94 is made of a metal whose coefficient of thermal conductivity is high such as copper (Cu), aluminium (Al), alloy thereof or the like, for example. The adhesion layer 70 directly contacts a metal surface that composes the surface of the projection portion 94.

As such, even when the projection portion 94 including the linear projection portions 94*a* and 94*b* where the linear projection portions 94*a* are in parallel to one of sides of the upper surface of the heat spreader 80B is provided on the upper surface of the heat spreader BOB, the advantages same as those of the alternative example 1 of the first embodiment can be obtained. Here, similar to the first embodiment, the projection portion 94 may be provided at substantially the entirety of the upper surface of the heat spreader 80E.

Alternative Example 3 of First Embodiment

In an alternative example 3 of the first embodiment, another example is explained in which the projection portions having a plan shape different from that of the alternative example 1 of the first embodiment are provided. In the alternative example 3 of the first embodiment, the components same as those explained above are given the same reference numerals, and explanations are not repeated.

Figure 10:
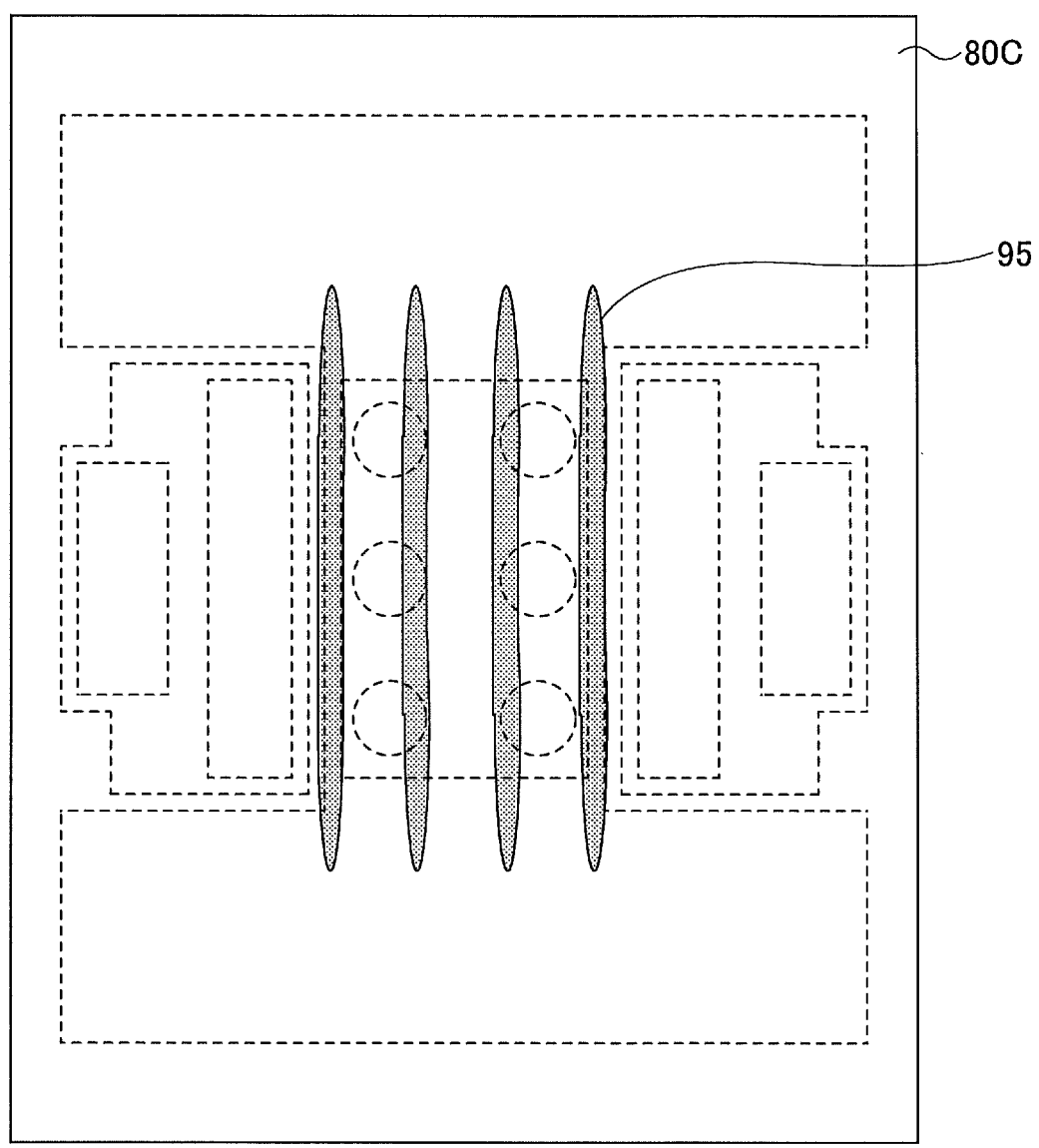
FIG. 10 is a view illustrating an example of the wiring substrate of an alternative example 3 of the first embodiment.

In the alternative example 3 of the first embodiment, a cross-sectional view of a wiring substrate 1C is similar to that illustrated in FIG. 8A, and thus is omitted. Although FIG. 10 is a view illustrating a heat spreader 80C and projection portions 95 of the alternative example 3 of the first embodiment, in order to facilitate understanding of the positional relationship between the through wirings 50 and the like, the through wirings 50 and the like are expressed by dotted lines for explanation purposes (reference numerals are omitted).

In the wiring substrate 1A, the projection portion 92 including the linear projection portions 92a and 92b extending in two directions, is provided in the vicinity of an area of the upper surface of the heat spreader 80A below the through wirings 50. However, as illustrated in FIG. 10, in the wiring substrate 1C, linear projection portions 95 that are extending in one direction, are provided in the vicinity of an area of the upper surface of the heat spreader 80C below the through wirings 50. In this embodiment, the projection portions 95 do not contact the through wirings 50. The height or the cross-sectional shape of the projection portions 95 may be the same as that of the projection portion 92, for example.

Different from random concavo-convex portions formed by abrasive blasting or the like, the projection portions 95 are formed to have a certain regularity by press working or the like. In this embodiment, as illustrated in FIG. 10, the projection portions 95 are provided in a stripe-form (striped pattern) on a part of the upper surface of the heat spreader 80C.

The projection portions 95 are aligned in substantially parallel with each other with a predetermined space therebetween at the part of the upper surface of the heat spreader 80C. The projection portions 95 are provided in a substantially parallel relationship with one of sides of the upper surface of the heat spreader 80C. The width or the space of the linear projection portions 95 may be the same as that of the linear projection portions 92a and 92b, for example. However, the space between the adjacent projection portions 95 may be adjusted such that the density of the projection portions 95 becomes similar to that of the mesh-form projection portion 92 or the like. Further, the projection portions 95 may be placed on the upper surface of the heat spreader 80C as being rotated at an arbitrarily angle (45°, 90° or the like) from the position illustrated in FIG. 10.

The projection portions 95 are integrally formed with the heat spreader 80C. This means that the composition of the projection portions 95 is the same as the composition of the heat spreader 80C. The projection portions 95 are made of a metal whose coefficient of thermal conductivity is high such as copper (Cu), aluminium (Al), alloy thereof or the like, for example. The adhesion layer 70 directly contacts a metal surface that composes the surface of the projection portions 95.

As such, even when the stripe-form projection portions 95 are placed on the upper surface of the heat spreader 80C, the advantages same as those of the alternative example 1 of the first embodiment in which the mesh-form projection portion 92 is placed can be obtained. Here, similar to the first embodiment, the projection portions 95 may be provided at substantially the entirety of the upper surface of the heat spreader 80C.

Alternative Example 4 of First Embodiment

In an alternative example 4 of the first embodiment, another example is explained in which the projection portions having a plan shape different from that of the alternative example 1 of the first embodiment are provided. In the alternative example 4 of the first embodiment, the components same as those explained above are given the same reference numerals, and explanations are not repeated.

Figure 11:
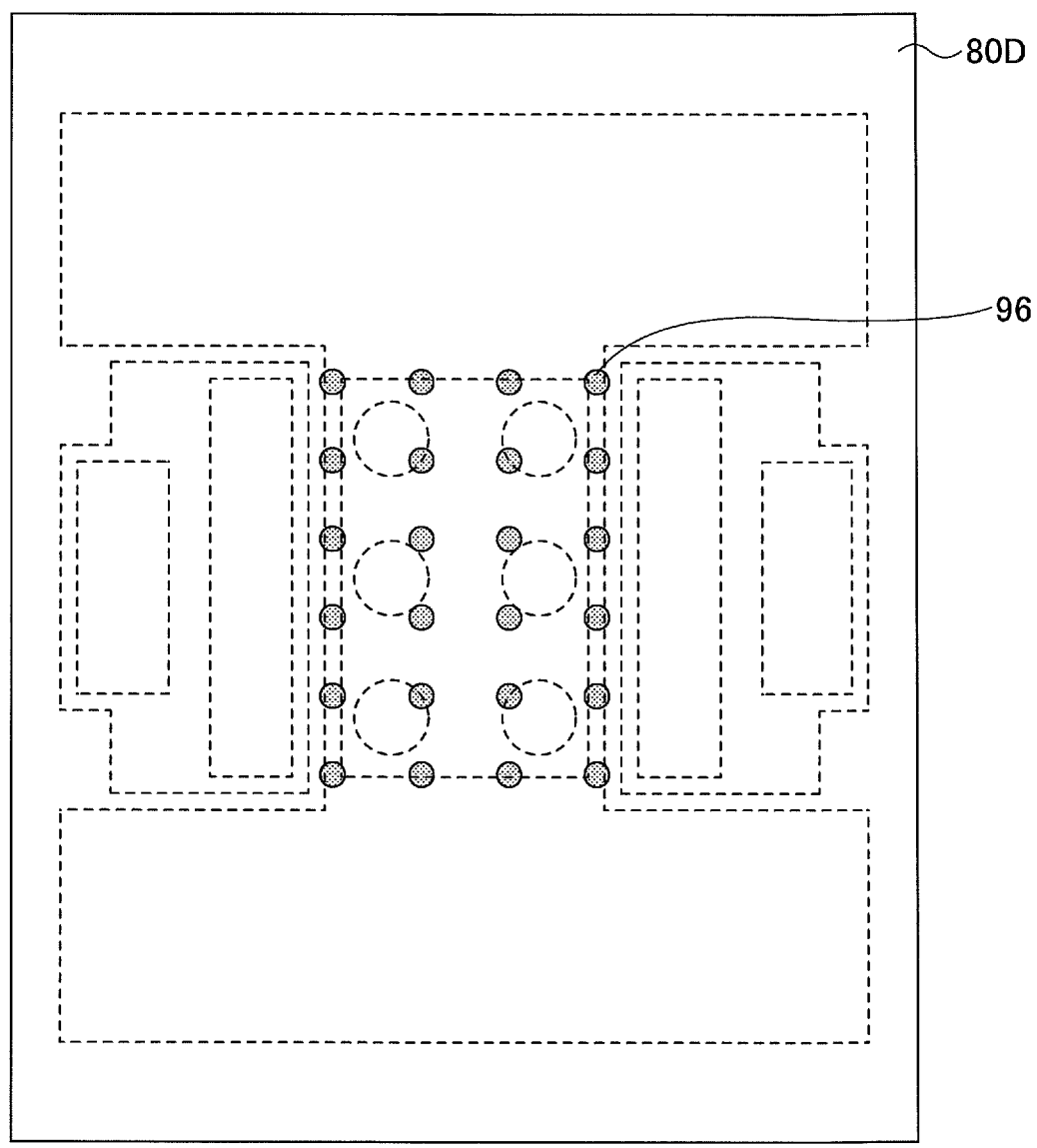
FIG. 11 is a view illustrating an example of the wiring substrate of an alternative example 4 of the first embodiment.

In the alternative example 4 of the first embodiment, a cross-sectional view of a wiring substrate 1C is similar to that illustrated in FIG. 8A, and thus is omitted. Although FIG. 11 is a view illustrating a heat spreader 80D and projection portions 96 of the alternative example 4 of the first embodiment, in order to facilitate understanding of the positional relationship between the through wirings 50 and the like, the through wirings 50 and the like are expressed by dotted lines for explanation purposes (reference numerals are omitted).

In the wiring substrate 1A, the mesh-form projection portion 92 is provided in the vicinity of an area of the upper surface of the heat spreader 80A below the through wirings 50. However, as illustrated in FIG. 11, in the wiring substrate 1D, dot-form (polka-dot patterns) projection portions 96 are provided in the vicinity of an area of the upper surface of the heat spreader 80D below the through wirings 50. Different from random concavo-convex portions formed by abrasive blasting or the like, the projection portions 96 are formed to have a certain regularity by press working or the like. In this embodiment, the projection portions 96 do not contact the through wirings 50. The height or the cross-sectional shape of the projection portions 96 may be the same as that of the projection portion 92, for example.

A plan shape of each of the projection portions 96 may be a circular shape with a diameter of about 10 to 100 μm, for example. The space between the adjacent projection portions 96 may be about 10 to 100 μm, for example. Here, the space between the adjacent projection portions 96 may be adjusted such that the density of the projection portions 96 becomes similar to that of the mesh-form projection portion 92 or the like. The plan shape of each of the projection portions 96 may be an ellipse shape or a rectangular shape. The projection portions 96 may be placed in a staggered manner or the like on the upper surface of the heat spreader 80D.

The projection portions 96 are integrally formed with the heat spreader 80D. This means that the composition of the projection portions 96 is the same as the composition of the heat spreader 80D. The projection portions 96 are made of a metal whose coefficient of thermal conductivity is high such as copper (Cu), aluminium (Al), alloy thereof or the like, for example. The adhesion layer 70 directly contacts a metal surface that composes the surface of the projection portions 96.

As such, even when the dot-form projection portions 96 are placed on the upper surface of the heat spreader 80D, the advantages same as those of the alternative example 1 of the first embodiment in which the mesh-form projection portion 92 is placed can be obtained. Here, similar to the first embodiment, the projection portions 96 may be provided at substantially the entirety of the upper surface of the heat spreader 80D.

Second Embodiment

In the second embodiment, an example is explained in which the projection portion contacts the through wirings. In the second embodiment, the components same as those explained above are given the same reference numerals, and explanations are not repeated.

Figure 12A:
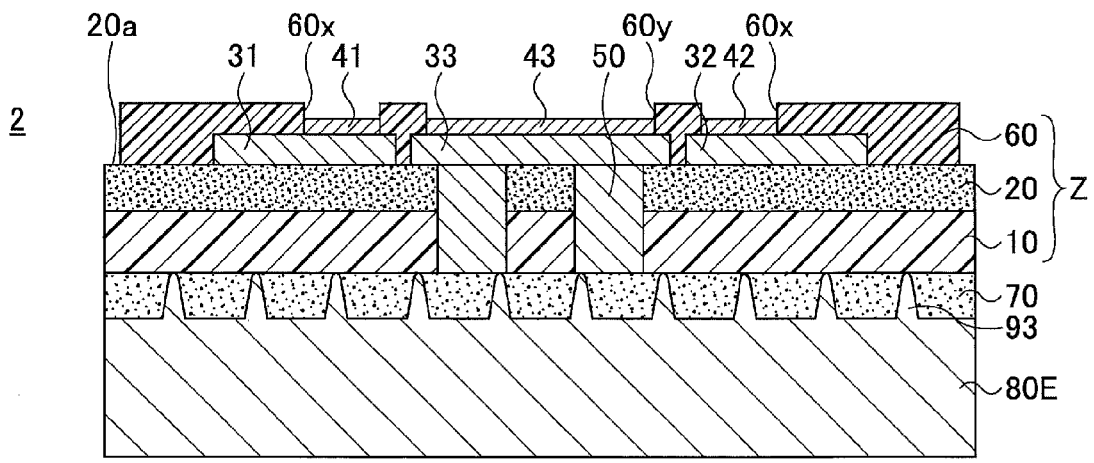
FIG. 12A and FIG. 12B are views illustrating an example of the wiring substrate of a second embodiment.
Figure 12B:
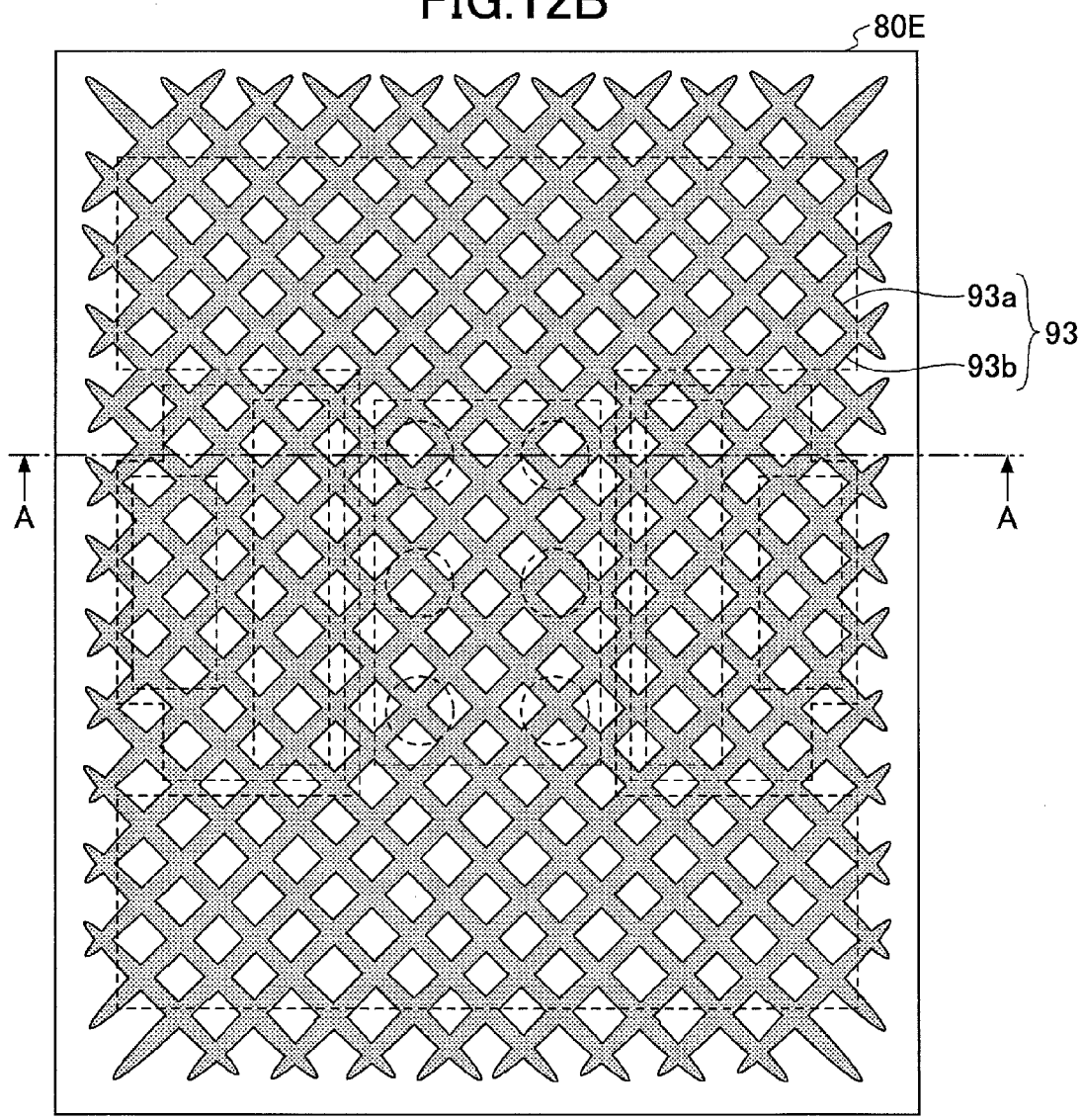

In the second embodiment, a plan view of a wiring substrate is the same as that illustrated in FIG. 1B, and thus is omitted. FIG. 12A is a cross-sectional view. Although FIG. 12B is a view illustrating a heat spreader 80E and a projection portion 93, in order to facilitate understanding of the positional relationship between the through wirings 50 and the like, the through wirings 50 and the like are expressed by dotted lines for explanation purposes (reference numerals are omitted).

In the wiring substrate 1, the projection portion 91 does not contact the through wirings 50. However, as illustrated in FIG. 12A, in a wiring substrate 2, a projection portion 93 contacts the through wirings 50. This means that the height of the projection portion 93 is greater than the thickness of the adhesion layer 70. The plan shape or the cross-sectional shape of the projection portion 93 may be the same as that of the projection portion 91, for example. In other words, the width or the space of each of linear projection portions 93a and 93b may be the same as that of each of the linear projection portions 91a and 91b.

The projection portion 93 is integrally formed with the heat spreader 80E. This means that the composition of the projection portion 93 is the same as the composition of the heat spreader BOE. The projection portion 93 is made of a metal whose coefficient of thermal conductivity is high such as copper (Cu), aluminium (Al), alloy thereof or the like, for example. The adhesion layer 70 directly contacts a metal surface that composes the surface of the projection portion 93.

As such, even when the projection portion 93 contacts the through wirings 50, the advantages same as those of the first embodiment can be obtained. Here, similar to the alternative example 1 of the first embodiment, the projection portion 93 may be only provided in the vicinity of the area (the area that overlaps the through wirings 50 in a plan view) of the upper surface of the heat spreader 80 below the through wirings 50, that is a main radiation path. Further, the projection portion 93 similar to those of the alternative examples 2 to 4 of the first embodiment may be provided.

Third Embodiment

In the third embodiment, an example of a semiconductor package is illustrated in which a semiconductor device (light emitting device) is mounted on the wiring substrate of the first embodiment. In the third embodiment, the components same as those explained above are given the same reference numerals, and explanations are not repeated.

Figure 13:
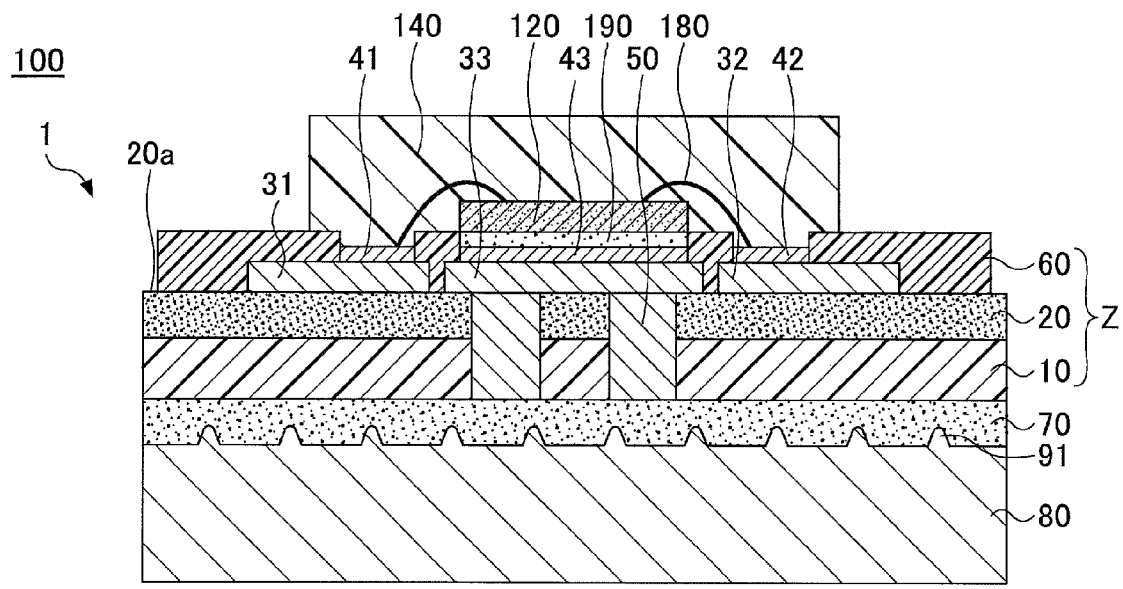
FIG. 13 is a cross-sectional view illustrating an example of a semiconductor package of a third embodiment.

FIG. 13 is a cross-sectional view illustrating an example of a semiconductor package 100 of the third embodiment. With reference to FIG. 13, in the semiconductor package 100, a semiconductor device 120 is mounted on the wiring 33 (thermal radiation wiring) at the area exposed from the open portion 60y of the insulating layer 60 via the plating film 43 of the wiring substrate 1. Specifically, the semiconductor device 120 is mounted on the plating film 43 of the wiring substrate 1 via an adhesion layer 190 such as a die attach film or the like in a face-up manner. The semiconductor device 120 is sealed by sealing resin 140.

For the semiconductor device 120, a light emitting device such as a Light Emitting Diode (LED) may be used. However, the light emitting device is not limited to the LED, and a surface-emitting laser or the like may be used, for example. In the following, an example in which the semiconductor device 120 is the LED is explained.

For example, a cathode terminal of the semiconductor device 120, that is the LED, is connected to the plating film 41 via the bonding wires 180, and an anode terminal of the semiconductor device 120 is connected to the plating film 42 via the bonding wires 180.

In the wiring substrate 1, the wiring 33 for thermal radiation is formed to have a larger area than a plan shape of the semiconductor device 120. Thus, the heat generated by the semiconductor device 120 can be efficiently radiated.

For example, by connecting the plating films 44 and 45 of the wiring substrate 1 to a power source, a drive circuit or the like provided outside of the semiconductor package 100, and supplying a predetermined potential difference between the cathode terminal and the anode terminal of the semiconductor device 120, the semiconductor device 120 emits light. The semiconductor device 120 generates heat when emitting light. The heat generated by the semiconductor device 120 is transferred to the through wirings 50 via the plating film 43 and the wiring 33. Then, the heat is further transferred to the heat spreader 80 via the adhesion layer 70 so that the heat is radiated by the heat spreader 80.

As the plurality of through wirings 50 are provided below the wiring 33 on which the semiconductor device 120 is mounted, heat generated by the semiconductor device 120 can be effectively transferred to the heat spreader 80. Further, as the projection portion 91 is provided on the upper surface of the heat spreader 80 at least at the area that overlaps the through wirings 50 in a plan view, a physical distance between the through wirings 50 and the heat spreader 80 become short. Thus, the heat resistance can be lowered and the thermal radiation property can be improved.

Further, a plurality of the semiconductor devices 120 may be mounted on the wiring substrate 1. For example, a plurality of the semiconductor devices 120 may be mounted on the wiring substrate 1 that are aligned in a direction perpendicular to a drawing surface of FIG. 13.

Alternative Example 1 of Third Embodiment

In an alternative example 1 of the third embodiment, another example of the semiconductor package is explained in which the semiconductor device (light emitting device) is mounted on the wiring substrate of the first embodiment. In the alternative example 1 of the third embodiment, the components same as those explained above are given the same reference numerals, and explanations are not repeated.

Figure 14:
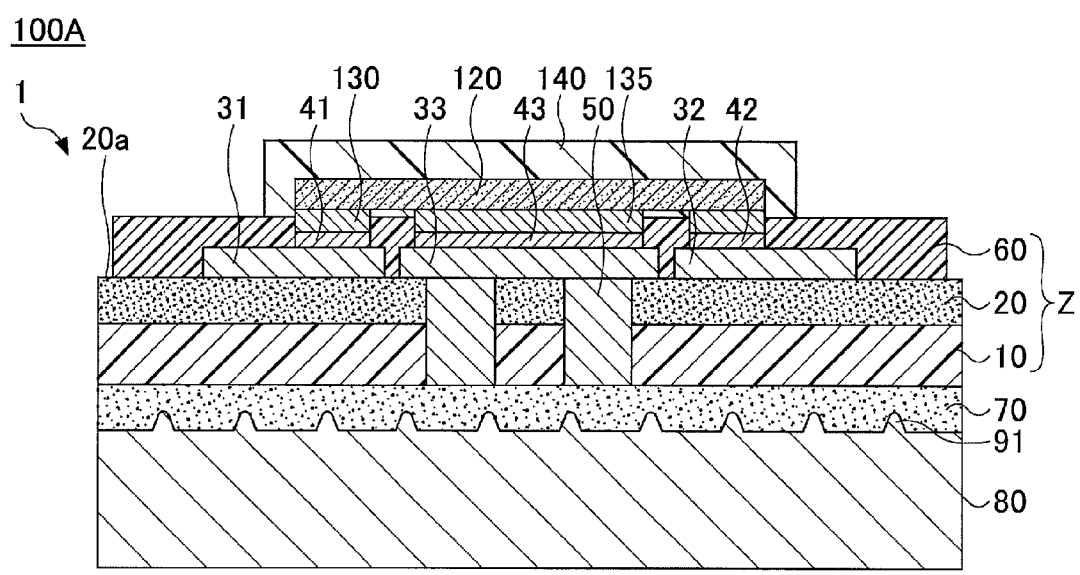
FIG. 14 is a cross-sectional view illustrating an example of the semiconductor package of an alternative example 1 of the third embodiment.

FIG. 14 is a cross-sectional view illustrating an example of a semiconductor package 100A of the alternative example 1 of the third embodiment. With reference to FIG. 14, the semiconductor package 100A includes the wiring substrate 1 (see FIG. 1A and FIG. 1B), the semiconductor device 120, solder (not illustrated in the drawings) and the sealing resin 140. The semiconductor device 120 is mounted on the wirings 31 and 32, which are the electrical connection wirings, at the open portions 60x (surfaces of the plating films 41 and 42) exposed from the insulating layer 60 and on the wiring 33, which is the thermal radiation wiring, at the open portion 60y (a surface of the plating film 43) of the insulating layer 60 of the wiring substrate 1.

Specifically, the semiconductor device 120 includes electrical connection terminals 130 and a thermal radiation terminal 135. The semiconductor device 120 is flip-chip mounted on the wirings 31 and 32 (via the plating films 41 and 42) and on the wiring 33 (via the plating film 43) via solder (not illustrated in the drawings) of the wiring substrate 1 in a face-down manner. Then, the semiconductor device 120 is sealed by the sealing resin 140. For the sealing resin 140, resin in which a fluorescent material is included in insulating resin such as epoxy-based resin, silicone-based resin or the like may be used, for example.

An anode terminal and a cathode terminal are provided at lower surfaces (surfaces facing the wiring substrate 1) of the electrical connection terminals 130 of each of the semiconductor devices 120, for example. One of the electrical connection terminals 130 of the semiconductor device 120 (LED) is connected to the plating film 41 of the wiring substrate 1 via the solder (not illustrated in the drawings), for example. Further, the other of the electrical connection terminals 130 of the semiconductor device 120 is connected to the plating film 42 of the wiring substrate 1 via the solder (not illustrated in the drawings), for example. Further, the thermal diffusion terminal 135 is provided in the vicinity of a center portion of the lower surface of the semiconductor device 120. The thermal diffusion terminal 135 is connected to the plating film 43 of the wiring substrate 1 via the solder (not illustrated in the drawings).

As described above in the first embodiment, in the wiring substrate 1, the wiring 33 that is the thermal diffusion wiring is formed to have a larger area than that of the thermal diffusion terminal 135 of the semiconductor device 120. Thus, the heat generated by the semiconductor device 120 can be efficiently diffused in a surface direction of the wiring 33.

For example, by connecting the plating films 44 and 45 of the wiring substrate 1 to a power source, a drive circuit or the like provided outside of the semiconductor package 100A, and supplying a predetermined potential difference between the electrical connection terminals 130 of the semiconductor device 120, the semiconductor device 120 emits light. The semiconductor device 120 generates heat when emitting light. The heat generated by the semiconductor device 120 is transferred to the through wirings 50 via the plating film 43 and the wiring 33. Then, the heat is further transferred to the heat spreader 80 via the adhesion layer 70 so that the heat is radiated by the heat spreader 80.

As the plurality of through wirings 50 are provided at the lower side of the thermal diffusion terminal 135 of the semiconductor device 120, the heat generated by the semiconductor device 120 can be efficiently transferred to the heat spreader 80. Further, as the projection portion 91 is provided on the upper surface of the heat spreader 80 at least at the area that overlaps the through wirings 50 in a plan view, a physical distance between the through wirings 50 and the heat spreader 80 becomes short. Thus, the heat resistance can be lowered and the thermal radiation property can be improved.

Further, a plurality of the semiconductor devices 120 may be mounted on the wiring substrate 1. For example, a plurality of the semiconductor devices 120 may be mounted on the wiring substrate 1 that are aligned in a direction perpendicular to a drawing surface of FIG. 14.

Although the semiconductor package is explained with reference to FIG. 13 and FIG. 14, preferable positional relationships between an outer shape of the semiconductor device 120 and the through wirings 50 in the semiconductor package are explained with reference to FIG. 15A to FIG. 15D.

FIG. 15A to FIG. 15D are views for explaining a positional relationship between an outer shape of the semiconductor device 120 and the through wirings 50. As illustrated in FIG. 15A to FIG. 15D, it is preferable that at least a part of the through wiring 50 is placed within a range of an outer shape of the semiconductor device 120 in a plan view. Further, it is preferable that two or more of the through wirings 50 are placed within the range of the outer shape of the semiconductor device 120 in a plan view.

Figure 15A:
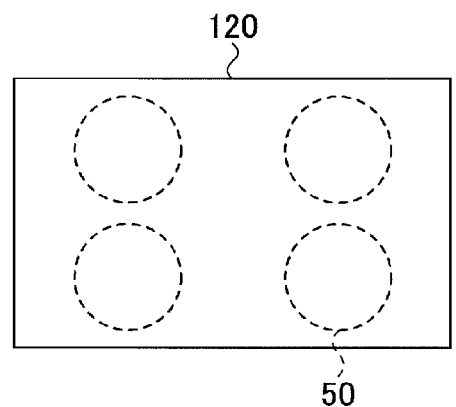
FIG. 15A to FIG. 15D are views for explaining a positional relationship between an outer shape of a semiconductor device and through wirings.

For example, as illustrated in FIG. 15A, all of the four through wirings 50 may be placed within the range of the outer shape of the semiconductor device 120 in a plan view. The number of the through wirings 50 placed within the range of the outer shape of the semiconductor device 120 may be one, two, three or more than four. As described above, it is preferable that the number of the through wirings 50 placed within the range of the outer shape of the semiconductor device 120 is two or more.

Figure 15B:
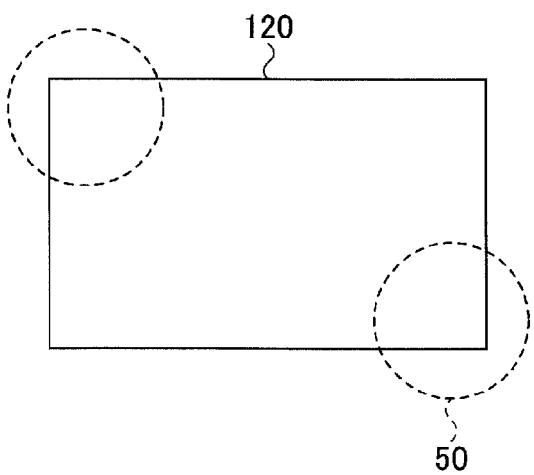
Figure 15C:
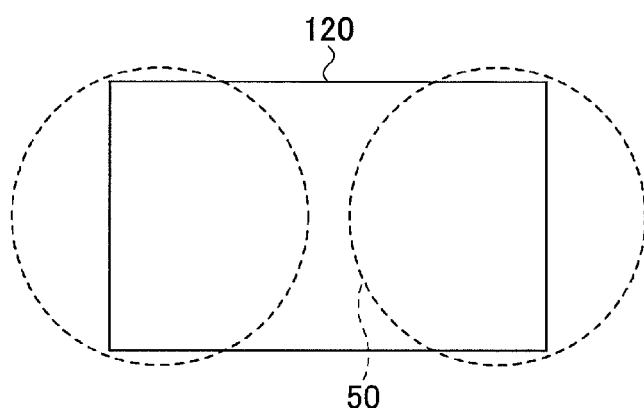

Further, as illustrated in FIG. 15B and FIG. 15C, a part of each of the through wirings 50 may not be placed within the range of the outer shape of the semiconductor device 120 provided that at least parts of two of the through wirings 50 are placed within the range of the outer shape of the semiconductor device 120, in a plan view. Further, the through wirings 50 may be placed in various arrangements such as two of them are at a diagonal with each other with respect to a side of the outer shape of the semiconductor device 120, or two of them are placed to face with each other with respect to a side of the outer shape of the semiconductor device 120.

Figure 15D:
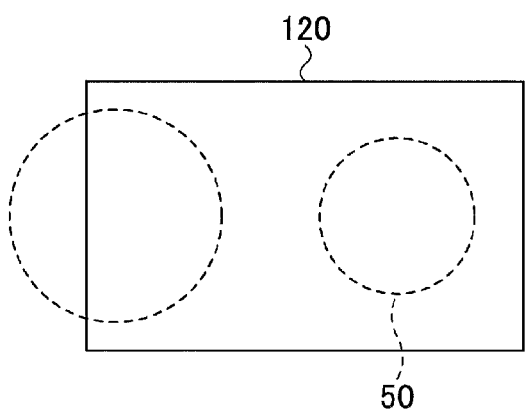

Further, as illustrated in FIG. 15D, the entirety of one of the through wirings 50 may be within the range of the outer shape of the semiconductor device 120 and a part of the other of the through wirings 50 may be within the range of the outer shape of the semiconductor device 120 provided that at least two through wirings 50 are placed to overlap the range of the outer shape of the semiconductor device 120, in a plan view. Further, the through wirings 50 having different plan shapes may be placed to overlap the range of the outer shape of the semiconductor device 120.

As illustrated in FIG. 15A to FIG. 15D, the thermal radiation property can be further improved by providing the plurality of through wirings 50 such that at least a part of each of the through wirings 50 overlap the region within the outer shape of the semiconductor device 120 in a plan view.

In other words, for example, if only a single through wiring 50 is placed within the range of the outer shape of the semiconductor device 120 in a plan view, heat tends to be concentrated on the single through wiring 50. Thus, thermal radiation effects may decrease. However, by providing the plurality (two or more) of through wirings 50 such that at least a part of each of them overlaps the region within the outer shape of the semiconductor device 120, concentration of heat can be prevented and the thermal radiation property can be improved.

Further, by providing the projection portion 91 of the heat spreader 80 at a range that overlaps the semiconductor device 120, the through wirings 50 and the wiring 33 in a plan view, concentration of heat below the semiconductor device 120 can be prevented, the thermal radiation property can be improved, and lowing of a light emitting function of the semiconductor device 120 can be prevented.

According to the embodiment, a wiring substrate or the like capable of ensuring an insulation property and improving a thermal radiation property at the same time can be provided.

Although a preferred embodiment of the wiring substrate or the like has been specifically illustrated and described, it is to be understood that minor modifications may be made therein without departing from the spirit and scope of the invention as defined by the claims.

The present invention is not limited to the specifically disclosed embodiments, and numerous variations and modifications may be made without departing from the spirit and scope of the present invention.

For example, as illustrated in FIG. 13, when the semiconductor device 120 is mounted in a face-up manner, and the back surface of the semiconductor device 120 and the plating film 43 are connected via the adhesion layer 190 without being connected by solder or the like, the entirety of the wiring 33 may be covered by the insulating layer 60 without providing the plating film 43. In other words, the insulating layer 60 may not be provided with the open portion that exposes the wiring 33. In such a case, the semiconductor device 120 is mounted on the insulating layer 60 that covers the wiring 33 via the adhesion layer 190. In other words, the insulating layer 60 exists right below the semiconductor device 120.

Here, instead of the semiconductor device, a module including the semiconductor device may be provided on the wiring substrate 1 or the like. As an example of the module, a structure may be used that includes the semiconductor device mounted on the wirings formed on the substrate, a reflector mounted at an outer peripheral side of the semiconductor device on the substrate, resin that seals the semiconductor device and the reflector, and external connection terminals exposed from the resin.

Further, instead of adhering the metal layer 30A to the insulating layer 10 via the adhesion layer 20, the following method may be used. That is, a method of preparing a polyimide-based resin film (polyimide tape) or the like as the insulating layer 10, and forming a metal layer made of copper (Cu) or the like directly on the one surface of the insulating layer 10 by electroless plating, sputtering, electroplating or the like (adhesion layer 20 is not provided) may be used. In such a case, the metal layer formed as such has the same function as the metal layer 30A and functions as the metal layer 30A. In such a case, the through holes 10x are only formed in the insulating layer 10 by laser processing or the like. In other words, one ends of the through holes 10x are covered by the metal layer formed on the insulating layer 10. In this case, the adhesion layer 20 is not provided.

Further, as another example, the insulating layer 10 may be formed by coating polyimide-based insulating resin on a metal film such as a copper film or the like. In such a case as well, the through holes 10x are only formed in the insulating layer 10 by laser processing or the like. In other words, one ends of the through holes 10x are covered by the metal film formed on the insulating layer 10. In this case as well, the adhesion layer 20 is not provided.

What is claimed is:

1. A wiring substrate on which a semiconductor device is to be mounted, the wiring substrate comprising:
   a heat spreader;
   a first insulating layer provided on the heat spreader via an adhesion layer, the first insulating layer being provided with a plurality of through holes penetrating the first insulating layer in the thickness direction;
   a plurality of through wirings formed to fill the through holes provided at the first insulating layer, respectively;
   a thermal diffusion wiring provided on the first insulating layer so as to be connected to the through wirings, the thermal diffusion wiring being configured not to be electrically connected to the semiconductor device;
   an electrical connection wiring provided on the first insulating layer, the electrical connection wiring being configured to be electrically connected to the semiconductor device; and
   a second insulating layer provided on the first insulating layer and provided with a first open portion that exposes the electrical connection wiring and a second open portion that exposes the thermal diffusion wiring,
   wherein the heat spreader is provided with a projection portion at a surface of the heat spreader on which the adhesion layer is formed,
   wherein an end surface of each of the through wirings at an adhesion layer side and a bottom surface of the first insulating layer at an adhesion layer side are spaced apart from a front end of the projection portion, and the adhesion layer is filled between the through wirings and the first insulating layer, and the projection portion,
   wherein the projection portion is made of a composition same as the heat spreader, and
   wherein the projection portion is formed at least at an area overlapping the through wirings in a plan view.

2. The wiring substrate according to claim 1, wherein the projection portion is made of metal.

3. The wiring substrate according to claim 1, wherein the projection portion is formed to have a certain regularity.

4. The wiring substrate according to claim 3, wherein the projection portion is formed to have a reticulated pattern, a striped pattern or polka-dot patterns, in a plan view.

5. The wiring substrate according to claim 1, wherein the thermal diffusion wiring is formed to extend at an outer side of the second open portion and have a larger area than the electrical connection wiring, in a plan view.

6. The wiring substrate according to claim 1, wherein, in a plan view, at least one of the plurality of through wirings is placed such that at least a part of the one through wiring overlaps a range within an outer shape of the semiconductor device, which is to be mounted on the wiring substrate.

7. The wiring substrate according to claim 1, wherein the electrical connection wiring is only formed on a plane surface, and
   wherein the through wirings do not exist in the first insulating layer and in the adhesion layer at an area overlapping with the electrical connection wiring in a plan view.

8. A semiconductor package comprising:
   the wiring substrate according to claim 1; and
   the semiconductor device mounted on a surface of the thermal diffusion wiring that is exposed from the second insulating layer.

9. A wiring substrate on which a semiconductor device is to be mounted, the wiring substrate comprising:
   a heat spreader;
   a first insulating layer provided on the heat spreader via an adhesion layer, the first insulating layer being provided with a plurality of through holes penetrating the first insulating layer in the thickness direction;
   a plurality of through wirings formed to fill the through holes provided at the first insulating layer, respectively;
   a thermal diffusion wiring provided on the first insulating layer so as to be connected to the through wirings, the thermal diffusion wiring being configured not to be electrically connected to the semiconductor device;
   an electrical connection wiring provided on the first insulating layer, the electrical connection wiring being configured to be electrically connected to the semiconductor device; and
   a second insulating layer provided on the first insulating layer and provided with a first open portion that exposes the electrical connection wiring and a second open portion that exposes the thermal diffusion wiring,
   wherein the heat spreader is provided with a projection portion at a surface of the heat spreader on which the adhesion layer is formed,
   wherein the projection portion is made of a composition same as the heat spreader,
   wherein the projection portion is formed at least at an area overlapping the through wirings in a plan view,
   wherein the projection portion is formed to have a certain regularity, and
   wherein the projection portion is formed to have a striped pattern, in a plan view.

* * * * *